US011958087B2

(12) United States Patent
Suzuki et al.

(10) Patent No.: US 11,958,087 B2
(45) Date of Patent: Apr. 16, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Kei Suzuki, Kyoto (JP); Masaki Inaba, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 17/892,500

(22) Filed: Aug. 22, 2022

(65) Prior Publication Data

US 2023/0098810 A1   Mar. 30, 2023

(30) Foreign Application Priority Data

Sep. 24, 2021 (JP) ................................. 2021-155177

(51) Int. Cl.
*B08B 3/08* (2006.01)
*B08B 5/00* (2006.01)
*B08B 13/00* (2006.01)

(52) U.S. Cl.
CPC .................. *B08B 3/08* (2013.01); *B08B 5/00* (2013.01); *B08B 13/00* (2013.01)

(58) Field of Classification Search
CPC .. B08B 3/08; B08B 5/00; B08B 13/00; H01L 21/67109; H01L 21/67742; H01L 21/67757; H01L 21/67057
See application file for complete search history.

(56) References Cited

U.S. PATENT DOCUMENTS

| 2001/0004898 A1* | 6/2001 | Kamikawa ........ H01L 21/67028 438/689 |
| 2001/0038089 A1 | 11/2001 | Levenson et al. ........... 252/79.1 |
| 2004/0063319 A1* | 4/2004 | Toshima ........... H01L 21/31138 438/689 |
| 2005/0217793 A1 | 10/2005 | Hasegawa et al. ...... 156/345.18 |
| 2006/0024213 A1 | 2/2006 | Arai .............................. 422/129 |

(Continued)

FOREIGN PATENT DOCUMENTS

| JP | H05152203 A | * | 6/1993 | ........... H01L 21/304 |
| KP | 20230019312 A | * | 2/2023 | ............. H01L 21/67 |

(Continued)

OTHER PUBLICATIONS

Machine translation of JP-H05152203-A (Year: 1993).*
Machine translation of KR-20230019312-A (Year: 2023).*

*Primary Examiner* — Erin F Bergner
(74) *Attorney, Agent, or Firm* — OSTROLENK FABER LLP

(57) ABSTRACT

A substrate processing method is provided, which includes: a sulfuric acid immersing step of immersing a plurality of substrates in a sulfuric acid-containing liquid within a sulfuric acid vessel; a transporting step of taking out the substrates from the sulfuric acid vessel and transporting the substrates to an ozone gas treatment unit; and an ozone exposing step of exposing the substrates transported to the ozone gas treatment unit to an ozone-containing gas. The ozone gas treatment unit may include a gas treatment chamber which accommodates the substrates. The ozone exposing step may include the step of placing the substrates taken out of the sulfuric acid vessel in a treatment space within the gas treatment chamber to expose the substrates to the ozone-containing gas.

7 Claims, 32 Drawing Sheets

(56) References Cited

U.S. PATENT DOCUMENTS

| | | | |
|---|---|---|---|
| 2010/0218791 A1 | 9/2010 | Tanaka et al. | 134/30 |
| 2011/0130009 A1 | 6/2011 | Kumnig et al. | 438/745 |
| 2011/0139192 A1* | 6/2011 | Koide | H01L 21/3065 134/94.1 |
| 2013/0233351 A1 | 9/2013 | Brown | 134/18 |
| 2014/0045339 A1 | 2/2014 | Iwata et al. | 438/745 |
| 2014/0130367 A1* | 5/2014 | Yonekawa | H01L 21/67034 34/380 |
| 2017/0018423 A1* | 1/2017 | Starrs | H01L 21/02076 |

FOREIGN PATENT DOCUMENTS

| | | | |
|---|---|---|---|
| TW | 201409188 A | 3/2014 | |
| WO | WO 2014082212 A1 | 6/2014 | |

* cited by examiner

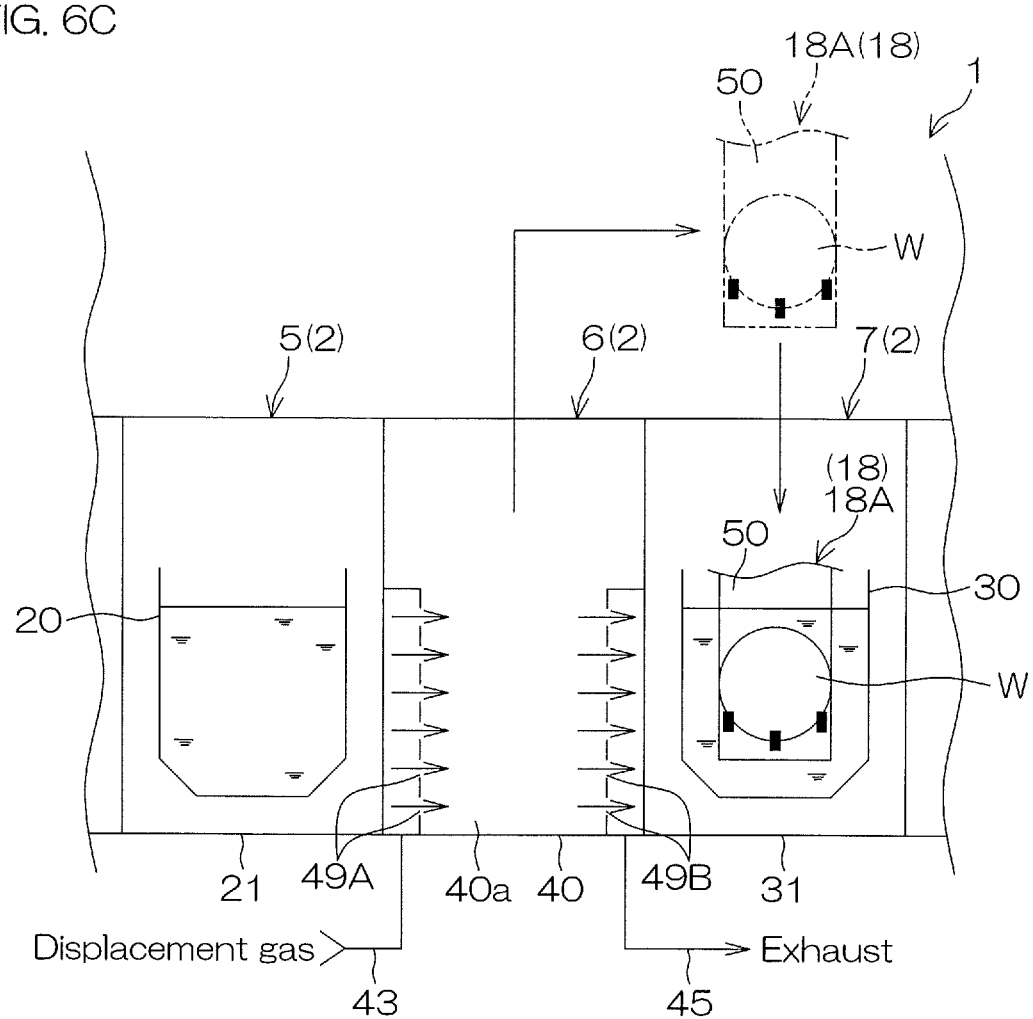

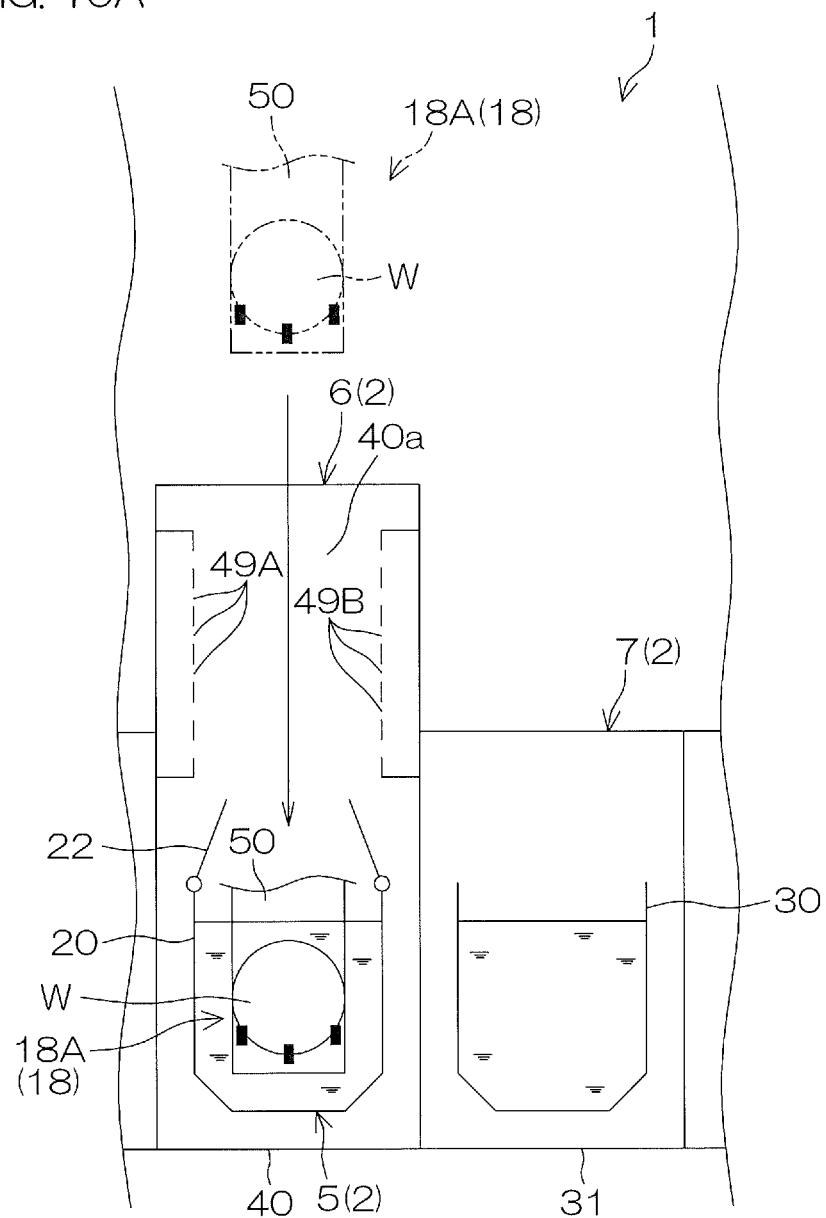

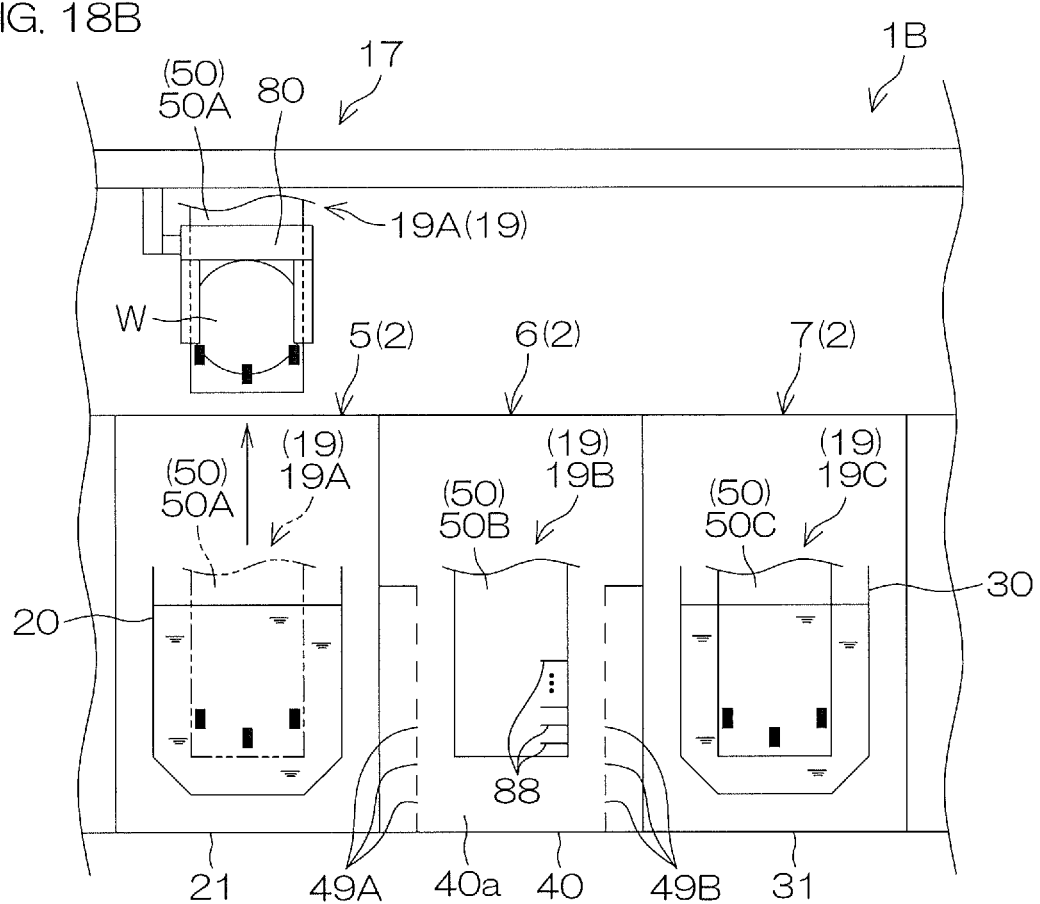

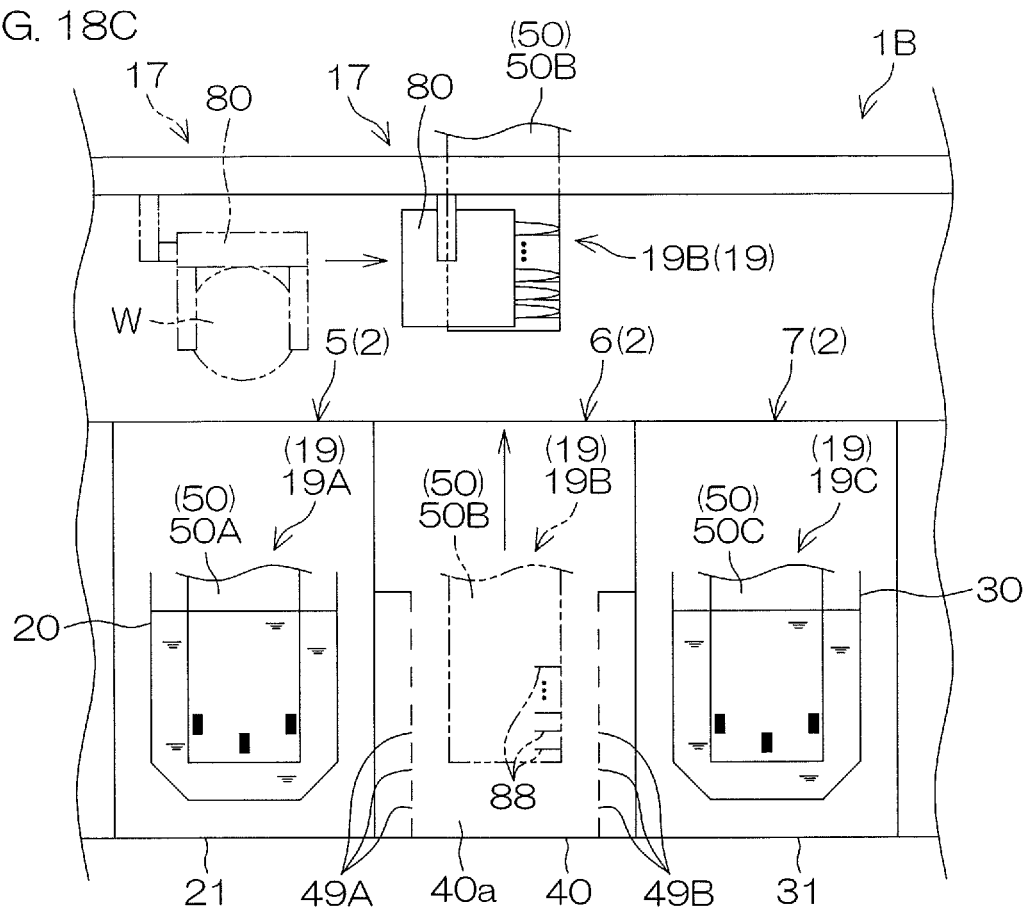

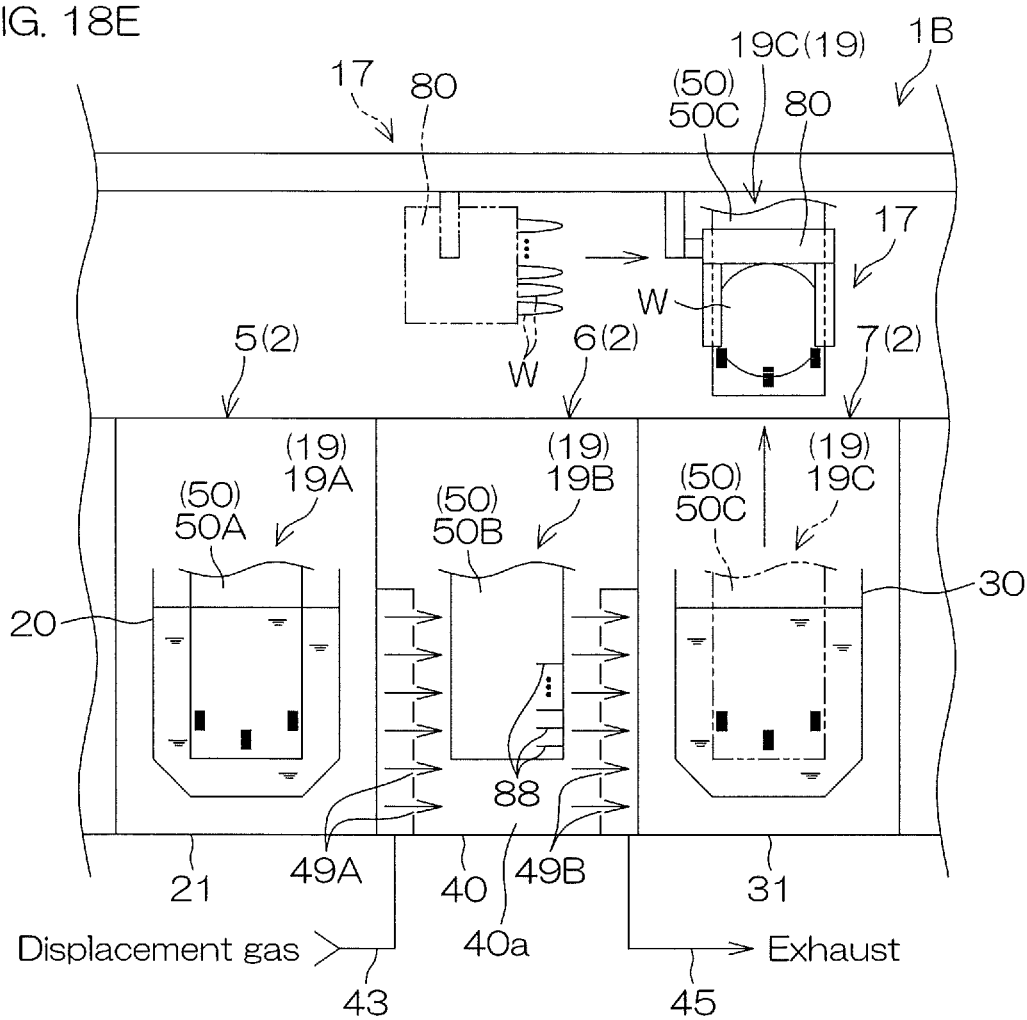

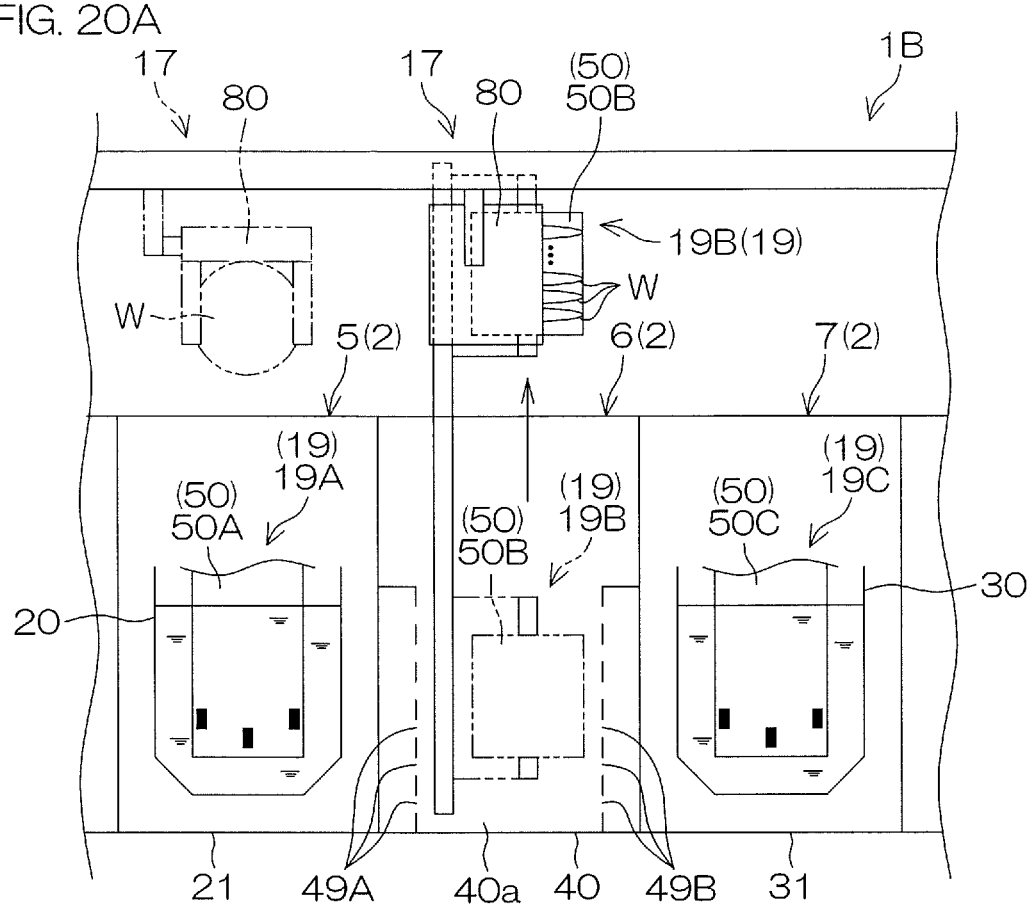

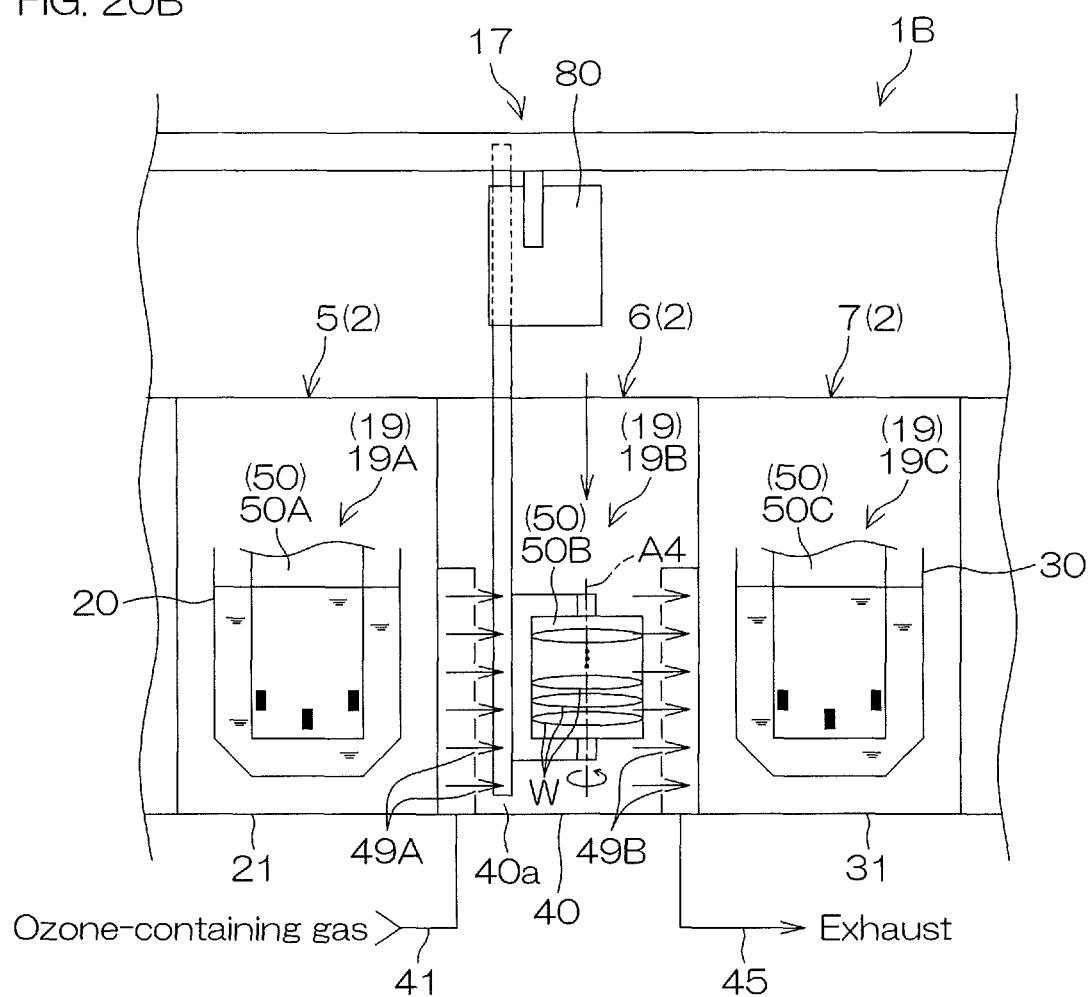

SUBSTRATE PROCESSING METHOD AND SUBSTRATE PROCESSING APPARATUS

CROSS REFERENCE TO RELATED APPLICATIONS

This application claims the priority benefit of Japanese Patent Application No. 2021-155177 filed on Sep. 24, 2021, the disclosure of which is entirely incorporated herein by reference.

BACKGROUND OF THE INVENTION

1. Field of the Invention

The present invention relates to a substrate processing method for processing a substrate, and to a substrate processing apparatus for processing a substrate. Exemplary substrates to be processed include semiconductor wafers, substrates for FPDs (Flat Panel Displays) such as liquid crystal display devices and organic EL (electroluminescence) display devices, substrates for optical disks, substrates for magnetic disks, substrates for magneto-optical disks, substrates for photomasks, ceramic substrates, and substrates for solar cells.

2. Description of the Related Art

In a substrate processing apparatus disclosed in US2014/0045339A1, ozone gas is supplied to sulfuric acid and dissolved in the sulfuric acid in piping, whereby sulfuric acid/ozone is provided. By mixing the sulfuric acid and the ozone together, peroxodisulfuric acid ($S_2O_8^{2-}$) is generated as an active species (etchant).

In the substrate processing apparatus of US2014/0045339A1, the sulfuric acid/ozone flows through a sulfuric acid/ozone supply pipe into a water mixing portion to be mixed with water, whereby a sulfuric acid/ozone/water mixture liquid is generated. While a substrate is rotated, the sulfuric acid/ozone/water mixture liquid is spouted toward the substrate from a sulfuric acid/ozone/water nozzle to be supplied onto a surface of the substrate, whereby a resist is removed from the surface of the substrate.

SUMMARY OF THE INVENTION

In the substrate processing apparatus disclosed in US2014/0045339A1, the temperature of the sulfuric acid/ozone/water mixture liquid is increased, as compared with the temperature of the sulfuric acid/ozone before the mixing, by dilution heat generated when the sulfuric acid/ozone is mixed with the water. Therefore, even if the sulfuric acid/ozone to be mixed with the water has a relatively low temperature, the sulfuric acid/ozone/water mixture liquid to be supplied to the surface of the substrate has a temperature necessary for the removal of the resist. Further, where the sulfuric acid/ozone to be mixed has a relatively low temperature, a greater amount of the ozone gas can be dissolved in the sulfuric acid/ozone before the mixing.

In the apparatus of US2014/0045339A1, however, the concentration of the peroxodisulfuric acid having an oxidative power is liable to be reduced by mixing the sulfuric acid/ozone with the water. Therefore, it may be impossible to provide a sufficient oxidative power.

An embodiment of the present invention provides a substrate processing method and a substrate processing apparatus which are capable of speedily and sufficiently removing an organic film such as of a resist from a substrate.

The embodiment of the present invention provides a substrate processing method, which includes: a sulfuric acid immersing step of immersing a plurality of substrates in a sulfuric acid-containing liquid within a sulfuric acid vessel; a transporting step of taking out the substrates from the sulfuric acid vessel and transporting the substrates to an ozone gas treatment unit; and an ozone exposing step of exposing the substrates transported to the ozone gas treatment unit to an ozone-containing gas.

According to the method, the substrates immersed in the sulfuric acid-containing liquid at a time are exposed to the ozone-containing gas by the ozone gas treatment unit. Thus, ozone contained in the ozone-containing gas is dissolved in the sulfuric acid-containing liquid adhering to the substrates taken out of the sulfuric acid-containing liquid, whereby peroxodisulfuric acid is generated in the adhering sulfuric acid-containing liquid.

As a result, organic films such as of a resist can be speedily and sufficiently removed from the substrates.

The ozone-containing gas contains gaseous ozone (ozone gas), and the sulfuric acid-containing liquid contains sulfuric acid. The sulfuric acid-containing liquid is, for example, a sulfuric acid aqueous solution.

In the embodiment of the present invention, the ozone gas treatment unit includes a gas treatment chamber which accommodates the substrates. The ozone exposing step includes the step of placing the substrates taken out of the sulfuric acid vessel in a treatment space within the gas treatment chamber to expose the substrates to the ozone-containing gas.

According to the method, the substrates are generally simultaneously exposed to the ozone-containing gas in the treatment space. Therefore, the organic films can be more speedily and sufficiently removed from the substrates.

In the embodiment of the present invention, the ozone exposing step includes the step of supplying the ozone-containing gas into the treatment space from a plurality of supply orifices which open in a wall defining the treatment space, and exhausting the treatment space through a plurality of exhaust orifices which open in the wall, whereby the substrates placed in the treatment space is exposed to the ozone-containing gas.

According to the method, the ozone-containing gas is supplied into the treatment space from the supply orifices which open in the wall defining the treatment space, and the treatment space is exhausted through the exhaust orifices which open in the wall. Therefore, even if ozone in an atmosphere in contact with the sulfuric acid-containing liquid on the substrates is dissolved in the sulfuric acid-containing liquid to be thereby consumed, ozone is supplied to the atmosphere in contact with the sulfuric acid-containing liquid adhering to the substrates by supplying the ozone-containing gas into the treatment space. Therefore, the concentration of the ozone in the atmosphere in contact with the sulfuric acid-containing liquid on the substrates can be maintained at a sufficiently high level. Thus, the peroxodisulfuric acid can be generated in the sulfuric acid-containing liquid on the substrates.

In the embodiment of the present invention, the supply orifices are arranged in a plurality of supply orifice rows juxtaposed in a predetermined arrangement direction in the gas treatment chamber. Each of the supply orifice rows may include a plurality of the supply orifices. The ozone exposing step includes the step of placing the substrates in the treatment space so that the substrates are arranged in the arrangement direction and located between respective adjacent pairs of the supply orifice rows.

According to the method, the ozone-containing gas is supplied from the supply orifice rows between respective adjacent pairs of the substrates. Therefore, the ozone can be sufficiently supplied into the atmosphere in contact with the sulfuric acid-containing liquid on the substrates, and can be sufficiently dissolved in the sulfuric acid-containing liquid on the substrates. As a result, it is possible to suppress the uneven removal of the organic films from the substrates.

In the embodiment of the present invention, the sulfuric acid immersing step includes a vertical immersing step of immersing the substrates in the sulfuric acid-containing liquid within the sulfuric acid vessel while holding the substrates in a vertical attitude. The substrate processing method further includes an attitude changing step of changing the attitude of the substrates taken out of the sulfuric acid vessel from the vertical attitude to a horizontal attitude. The ozone exposing step includes a horizontal exposing step of exposing the substrates to the ozone-containing gas while holding the substrates in the horizontal attitude.

According to the method, the substrates held in the vertical attitude can be immersed in the sulfuric acid-containing liquid. Therefore, the substrates can be generally simultaneously immersed in the sulfuric acid-containing liquid. According to the method, the substrates are exposed to the ozone-containing gas after the attitude of the substrates is changed from the vertical attitude to the horizontal attitude. Therefore, the thickness variations of the sulfuric acid-containing liquid at different positions on each of the substrates can be suppressed, which may otherwise occur when the sulfuric acid-containing liquid adhering to the substrates held in the vertical attitude moves down by gravity. This suppresses the uneven removal of the organic film at different positions on each of the substrates.

In the embodiment of the present invention, the substrate processing method further includes a substrate rotating step of rotating the substrates held in the horizontal attitude about a vertical axis extending through the centers of the substrates before the exposure of the substrates to the ozone-containing gas in the ozone exposing step after the attitude changing step.

Therefore, an excess amount of the sulfuric acid-containing liquid can be removed from the substrates, thereby improving the thickness evenness of the sulfuric acid-containing liquid at different positions on each of the substrates. This improves the evenness of the ozone concentration of the sulfuric acid-containing liquid at different positions on each of the substrates. As a result, it is possible to suppress the uneven removal of the organic film at different positions on each of the substrates.

In the embodiment of the present invention, the treatment space is located just above the sulfuric acid vessel. The transporting step includes the step of lifting the substrates from the sulfuric acid vessel to place the substrates in the treatment space.

According to the method, the substrates are lifted from the sulfuric acid vessel by the unidirectional movement to be thereby moved from the sulfuric acid vessel to the treatment space. Therefore, the substrates can be speedily exposed to the ozone-containing gas after the sulfuric acid-containing liquid is applied to the substrates. Therefore, the organic films can be speedily removed from the substrates.

Another embodiment of the present invention provides a substrate processing apparatus, which includes: a sulfuric acid vessel which retains a sulfuric acid-containing liquid and is configured so that a plurality of substrates can be immersed in the sulfuric acid-containing liquid; an ozone gas treatment unit in which the substrates are exposed to an ozone-containing gas; and a transport unit which transports the substrates between the sulfuric acid vessel and the ozone gas treatment unit.

According to the apparatus, the substrates simultaneously immersed in the sulfuric acid-containing liquid are exposed to the ozone-containing gas by the ozone gas treatment unit. Thus, ozone contained in the ozone-containing gas is dissolved in the sulfuric acid-containing liquid adhering to the substrates taken out of the sulfuric acid-containing liquid, whereby peroxodisulfuric acid is generated in the sulfuric acid-containing liquid adhering to the substrates.

As a result, organic films such as of a resist can be speedily and sufficiently removed from the substrates.

In the embodiment of the present invention, the ozone gas treatment unit includes a gas treatment chamber having a treatment space capable of accommodating the substrates for exposing the substrates accommodated in the treatment space to the ozone-containing gas.

According to the apparatus, the substrates can be generally simultaneously exposed to the ozone-containing gas in the treatment space. Therefore, the organic films can be more speedily and sufficiently removed from the substrates.

In the another embodiment of the present invention, the gas treatment chamber includes a wall defining the treatment space, a plurality of supply orifices which open in the wall for supplying the ozone-containing gas into the treatment space, and a plurality of exhaust orifices which open in the wall for exhausting the treatment space.

According to the apparatus, the ozone-containing gas is supplied into the treatment space from the supply orifices which open in the wall defining the treatment space, and expelled from the treatment space through the exhaust orifices which open in the wall. Therefore, even if ozone in an atmosphere in contact with the sulfuric acid-containing liquid on the substrates is dissolved in the sulfuric acid-containing liquid to be thereby consumed, ozone is supplied to the atmosphere in contact with the sulfuric acid-containing liquid adhering to the substrates by supplying the ozone-containing gas into the treatment space. Therefore, the concentration of the ozone in the atmosphere in contact with the sulfuric acid-containing liquid on the substrates can be maintained at a sufficiently high level. This makes it possible to sufficiently generate the peroxodisulfuric acid in the sulfuric acid-containing liquid on the substrates.

In the another embodiment of the present invention, the supply orifices are arranged in a plurality of supply orifice rows juxtaposed in a predetermined arrangement direction in the gas treatment chamber. Each of the supply orifice rows may include a plurality of the supply orifices. The transport unit supports the substrates so as to arrange the substrates in the arrangement direction, and transports the substrates into the gas treatment chamber so that the substrates are located between respective adjacent pairs of the supply orifice rows.

According to the apparatus, the transport unit transports the substrates into the treatment space so as to locate the substrates between respective adjacent pairs of the supply orifice rows. Therefore, the ozone-containing gas can be supplied from the supply orifice rows between respective adjacent pairs of the substrates. This makes it possible to sufficiently supply the ozone into the atmosphere in contact with the sulfuric acid-containing liquid on the substrates, whereby the ozone can be sufficiently dissolved in the sulfuric acid-containing liquid on the substrates. As a result, it is possible to suppress the uneven removal of the organic films from the substrates.

In the another embodiment of the present invention, the sulfuric acid vessel is configured so that the substrates can be immersed in the sulfuric acid-containing liquid while being held in a vertical attitude. The treatment space is configured so that the substrates can be accommodated therein while being held in a horizontal attitude. The transport unit includes an attitude changing mechanism which changes the attitude of the substrates between the vertical attitude and the horizontal attitude.

According to the apparatus, the substrates held in the vertical attitude can be immersed in the sulfuric acid-containing liquid. Therefore, the substrates can be generally simultaneously immersed in the sulfuric acid-containing liquid. Further, where the substrates are transported to the gas treatment chamber after the attitude of the substrates is changed from the vertical attitude to the horizontal attitude by the attitude changing mechanism of the transport unit, the substrates held in the horizontal attitude can be exposed to the ozone-containing gas. Therefore, the thickness variations of the sulfuric acid-containing liquid at different positions on each of the substrates can be suppressed, which may otherwise occur when the sulfuric acid-containing liquid adhering to the substrates held in the vertical attitude moves down by gravity. This suppresses the uneven removal of the organic film at different positions on each of the substrates.

In the another embodiment of the present invention, the transport unit includes a transport robot having a lifter which supports the substrates. The attitude changing mechanism transforms the lifter to change the attitude of the substrates between the vertical attitude and the horizontal attitude.

According to the apparatus, after the substrates held in the vertical attitude are immersed in the sulfuric acid-containing liquid within the sulfuric acid vessel, the attitude of the substrates can be changed from the vertical attitude to the horizontal attitude by transforming the lifter of the transport robot. Then, the substrates held in the horizontal attitude can be exposed to the ozone-containing gas in the gas treatment chamber. Thus, the substrates can be transported from the sulfuric acid vessel to the gas treatment chamber with the attitude thereof changed by using the single robot. Without the need for transferring the substrates between different robots, the organic films can be speedily removed from the substrates.

In the another embodiment of the present invention, the treatment space is located just above the sulfuric acid vessel. The transport unit is movable up and down while supporting the substrates so as to transport the substrates between the gas treatment chamber and the sulfuric acid vessel.

According to the apparatus, the transport unit is moved up and down while supporting the substrates, whereby the substrates are transported between the gas treatment chamber and the sulfuric acid vessel. Therefore, the substrates are lifted from the sulfuric acid vessel by the unidirectional movement to be thereby moved from the sulfuric acid vessel to the treatment space. Thus, the substrates can be speedily exposed to the ozone-containing gas after the sulfuric acid-containing liquid is applied to the substrates. This makes it possible to speedily remove the organic films from the substrates.

In the another embodiment of the present invention, the substrate processing apparatus further includes a cover member which covers and uncovers the sulfuric acid vessel to separate the inside of the sulfuric acid vessel and the treatment space from each other. This substantially prevents the ozone-containing gas from being dissolved in the sulfuric acid-containing liquid retained in the sulfuric acid vessel. Therefore, substrates to be next subjected to the substrate treatment are substantially prevented from being removed of organic films before the start of the supply of the ozone-containing gas into the treatment space. This suppresses variations in peroxodisulfuric acid treatment period.

In the another embodiment of the present invention, the transport unit includes a first transport robot which transports the substrates held in the vertical attitude to the sulfuric acid vessel, a second transport robot which transports the substrates held in the horizontal attitude to the gas treatment chamber, and a main transport robot which transports the substrates between the first transport robot and the second transport robot. The attitude changing mechanism changes the attitude of the substrates transported by the main transport robot between the horizontal attitude and the vertical attitude.

According to the apparatus, the transportation of the substrates to the sulfuric acid vessel, the transportation of the substrates to the gas treatment chamber, and the change of the attitude of the substrates are achieved by the different robots. This makes the structures of the respective robots less complicated.

In the another embodiment of the present invention, the second transport robot transports the substrates held in the horizontal attitude to the gas treatment chamber, and rotates the substrates held in the horizontal attitude about a vertical axis extending through the centers of the substrates in the gas treatment chamber.

According to the apparatus, an excess amount of the sulfuric acid-containing liquid can be removed from the substrates by rotating the substrates in the gas treatment chamber. Since the sulfuric acid-containing liquid is removed by the rotation of the substrates, it is possible to improve the thickness evenness of the sulfuric acid-containing liquid at different positions on each of the substrates. This improves the evenness of the ozone concentration of the sulfuric acid-containing liquid at different positions on each of the substrates. As a result, it is possible to suppress the uneven removal of the organic film at different positions on each of the substrates.

In the another embodiment of the present invention, the substrate processing apparatus further includes a heating chamber in which the substrates are heated. The transport unit further includes a third transport robot which transports the substrates held in the horizontal attitude into the heating chamber and rotates the substrates held in the horizontal attitude about the vertical axis extending through the centers of the substrates in the heating chamber. The main transport robot transports the substrates among the sulfuric acid vessel, the gas treatment chamber and the heating chamber.

According to the apparatus, an excess amount of the sulfuric acid-containing liquid can be removed from the substrates by rotating the substrates in the heating chamber. Since the sulfuric acid-containing liquid is removed by the rotation of the substrates, it is possible to improve the thickness evenness of the sulfuric acid-containing liquid at different positions on each of the substrates.

Since the excess amount of the sulfuric acid-containing liquid is removed from the substrates in the heating chamber, it is possible to heat the substrates while removing the sulfuric acid-containing liquid. Where the heated substrates are transported into the gas treatment chamber via the main transport robot and the second transport robot, the substrates can be exposed to the ozone-containing gas after being removed of the excess amount of the sulfuric acid-containing liquid and heated. This makes it possible to enhance the activity of the peroxodisulfuric acid while improving the evenness of the ozone concentration of the sulfuric acid-containing liquid at different positions on each of the substrates. As a result, it is possible to further suppress the uneven removal of the organic film at different positions on each of the substrates.

The foregoing and other objects, features, and effects of the present invention will become more apparent from the following description of embodiments with reference to the attached drawings.

BRIEF DESCRIPTION OF THE DRAWINGS

FIGS. 6A to 6C are schematic diagrams for describing how the substrate processing apparatus performs the substrate treatment.

FIGS. 10A to 10C are schematic diagrams for describing how the substrate processing apparatus of the first modification performs the substrate treatment.

FIGS. 18A to 18E are schematic diagrams for describing how the substrate processing apparatus of the third embodiment performs the substrate treatment.

FIGS. 20A and 20B are schematic diagrams for describing how the substrate processing apparatus of the first modification of the third embodiment performs a substrate treatment.

DETAILED DESCRIPTION OF THE PREFERRED EMBODIMENTS

<Construction of Substrate Processing Apparatus According to First Embodiment>

Figure 1:
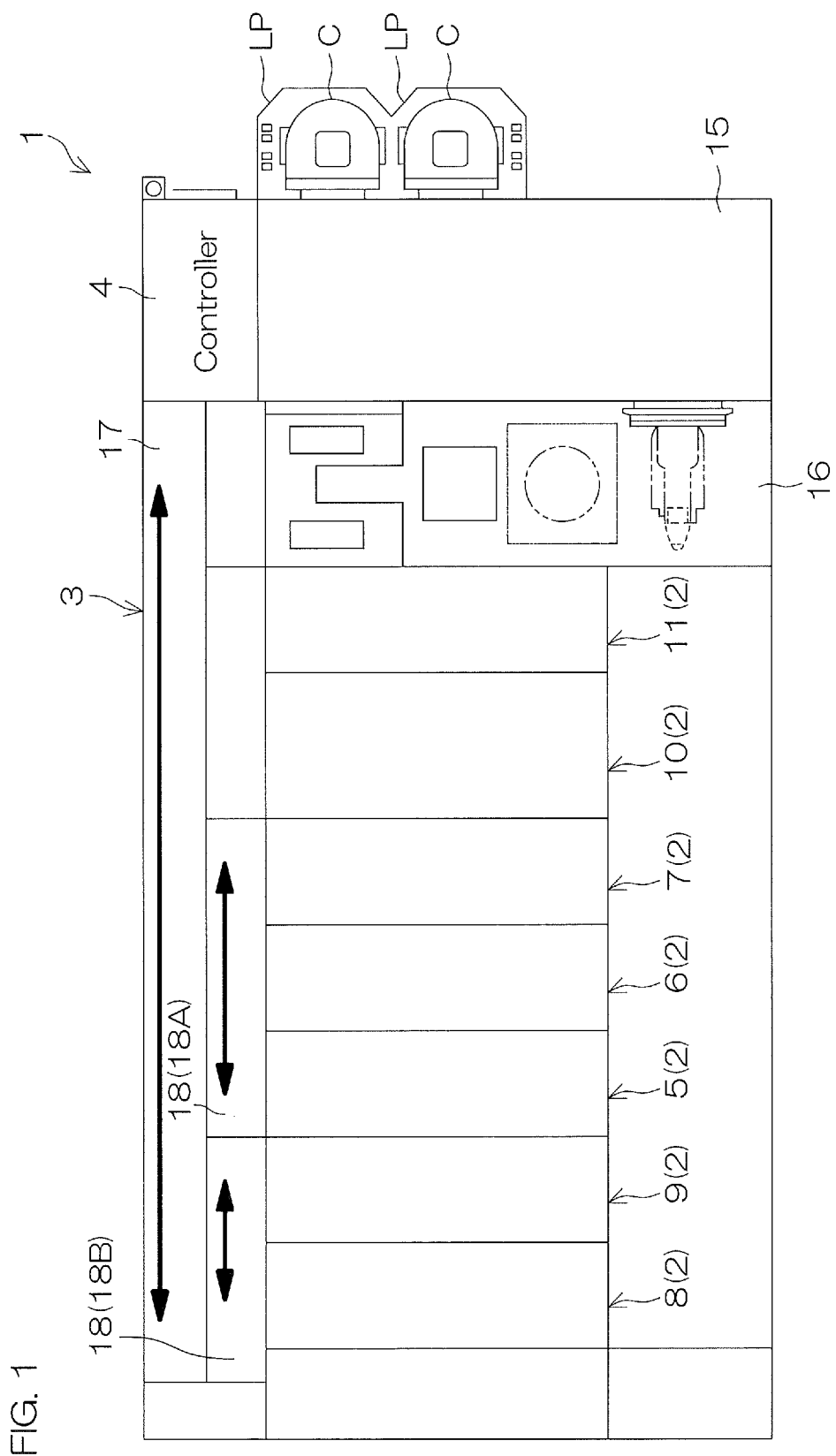
FIG. 1 is a schematic plan view showing the layout of a substrate processing apparatus according to a first embodiment of the present invention.

FIG. 1 is a schematic plan view showing the layout of a substrate processing apparatus 1 according to a first embodiment of the present invention.

The substrate processing apparatus 1 is a batch type apparatus adapted to treat a plurality of substrates W in batch. The substrate processing apparatus 1 includes load ports LP to which carriers C each containing disk-shaped substrates W such as semiconductor wafers are transported, a plurality of treatment units 2 in which substrates W transported from the load ports LP are treated with a treatment fluid, a transport unit 3 which transports the substrates W between the load ports LP and the treatment units 2, and a controller 4 which controls the substrate processing apparatus 1.

As will be detailed later, examples of the treatment fluid include treatment liquid and treatment gas. Examples of the treatment liquid include a chemical liquid, a rinse liquid, a sulfuric acid-containing liquid, and a hydrophilizing liquid. Examples of the treatment gas include an ozone-containing gas, a displacement gas, and a heating gas.

The treatment units 2 include a plurality of batch type liquid treatment units each adapted to treat the substrates W with the treatment liquid, and a batch type gas treatment unit adapted to treat the substrates W with the treatment gas.

The liquid treatment units include a sulfuric acid treatment unit 5 in which the substrates W are treated with the sulfuric acid-containing liquid, a first rinsing unit 7 in which the substrates W are rinsed with the rinse liquid, a chemical liquid treatment unit 8 in which the substrates W are treated with the chemical liquid, and a second rinsing unit 9 in which the substrates W are rinsed with the rinse liquid. The gas treatment unit includes an ozone gas treatment unit 6 in which the substrates W are treated with the ozone-containing gas.

The sulfuric acid-containing liquid is, for example, a sulfuric acid aqueous solution. The sulfuric acid aqueous solution contains sulfuric acid ($H_2SO_4$) and water ($H_2O$). The sulfuric acid aqueous solution is, for example, dilute sulfuric acid or concentrated sulfuric acid. The sulfuric acid-containing liquid may contain a substance other than sulfuric acid and water. The sulfuric acid-containing liquid may be prepared by mixing sulfuric acid and water such as DIW (deionized water).

The ozone-containing gas may be ozone gas or may be a gas mixture of ozone gas and a gas other than the ozone gas. An example of the gas other than the ozone gas is an inert gas. The inert gas to be contained in the ozone-containing gas may be, for example, nitrogen gas, a noble gas, or a gas mixture of the nitrogen gas and the noble gas. An example of the noble gas is argon gas. Examples of the displacement gas include an inert gas, air, and a gas mixture of the inert gas and air.

The rinse liquid is not limited to the DIW, but may be DIW, carbonated water, electrolyzed ion water, hydrochloric acid water having a dilute concentration (e.g., not lower than 1 ppm and not higher than 100 ppm), ammonia water having a dilute concentration (e.g., not lower than 1 ppm and not higher than 100 ppm), or reduced water (hydrogen water). The rinse liquid to be used in the first rinsing unit 7 and the rinse liquid to be used in the second rinsing unit 9 may be different from each other.

Examples of the chemical liquid include an ammonia/hydrogen peroxide mixture (APM liquid) and hydrofluoric acid.

The substrates W to be treated by the substrate processing apparatus 1 are, for example, substrates each having an organic film such as of a resist exposed on a major surface thereof.

The transport unit 3 includes a carrier transport device 15 which transports the carriers C between the load ports LP and the treatment units 2 and is capable of accommodating the carriers C, and an attitude changing robot 16 which loads and unloads the substrates W with respect to the carriers C held by the carrier transport device 15 and changes the attitude of the substrates W between a horizontal attitude and a vertical attitude.

The expression "to change the attitude of the substrates W between the vertical attitude and the horizontal attitude" means that the attitude of the substrates W can be changed from the vertical attitude to the horizontal attitude, and that the attitude of the substrates W can be changed from the horizontal attitude to the vertical attitude.

The term "horizontal attitude" means an attitude such that the major surfaces of the substrates W are horizontal. The term "vertical attitude" means an attitude such that the major surfaces of the substrates W are vertical. The vertical attitude may also be referred to as upright attitude.

The attitude changing robot 16 performs, in addition to the attitude changing operation, a batching operation for forming a single batch from a plurality of substrates W (e.g., 50 substrates W) taken out of a plurality of carriers C, and an unbatching operation for placing the substrates W of the single batch dividedly in a plurality of carriers C.

The transport unit 3 further includes a main transport robot 17 which transports the single batch of substrates W between the attitude changing robot 16 and the treatment units 2, and a plurality of auxiliary transport robots 18 which each transport the single batch of substrates W between the main transport robot 17 and the treatment units 2.

The auxiliary transport robots 18 include a first auxiliary transport robot 18A which transports the single batch of substrates W among the sulfuric acid treatment unit 5, the ozone gas treatment unit 6, and the first rinsing unit 7, and a second auxiliary transport robot 18B which transports the substrates W between the chemical liquid treatment unit 8 and the second rinsing unit 9.

The main transport robot 17 receives the single batch of substrates W from the attitude changing robot 16. The main transport robot 17 transfers the single batch of substrates W received from the attitude changing robot 16 to the first auxiliary transport robot 18A or the second auxiliary transport robot 18B, and receives the single batch of substrates W supported by the first auxiliary transport robot 18A or the second auxiliary transport robot 18B.

The treatment units 2 further include a drying unit 10 which dries the substrates W, and a cleaning unit 11 which cleans the main transport robot 17. The main transport robot 17 is further capable of transporting the single batch of substrates W to the drying unit 10.

The first auxiliary transport robot 18A transports the single batch of substrates W received from the main transport robot 17 among the sulfuric acid treatment unit 5, the ozone gas treatment unit 6 and the first rinsing unit 7. Similarly, the second auxiliary transport robot 18B transports the single batch of substrates W received from the main transport robot 17 between the chemical liquid treatment unit 8 and the second rinsing unit 9.

Figure 2:
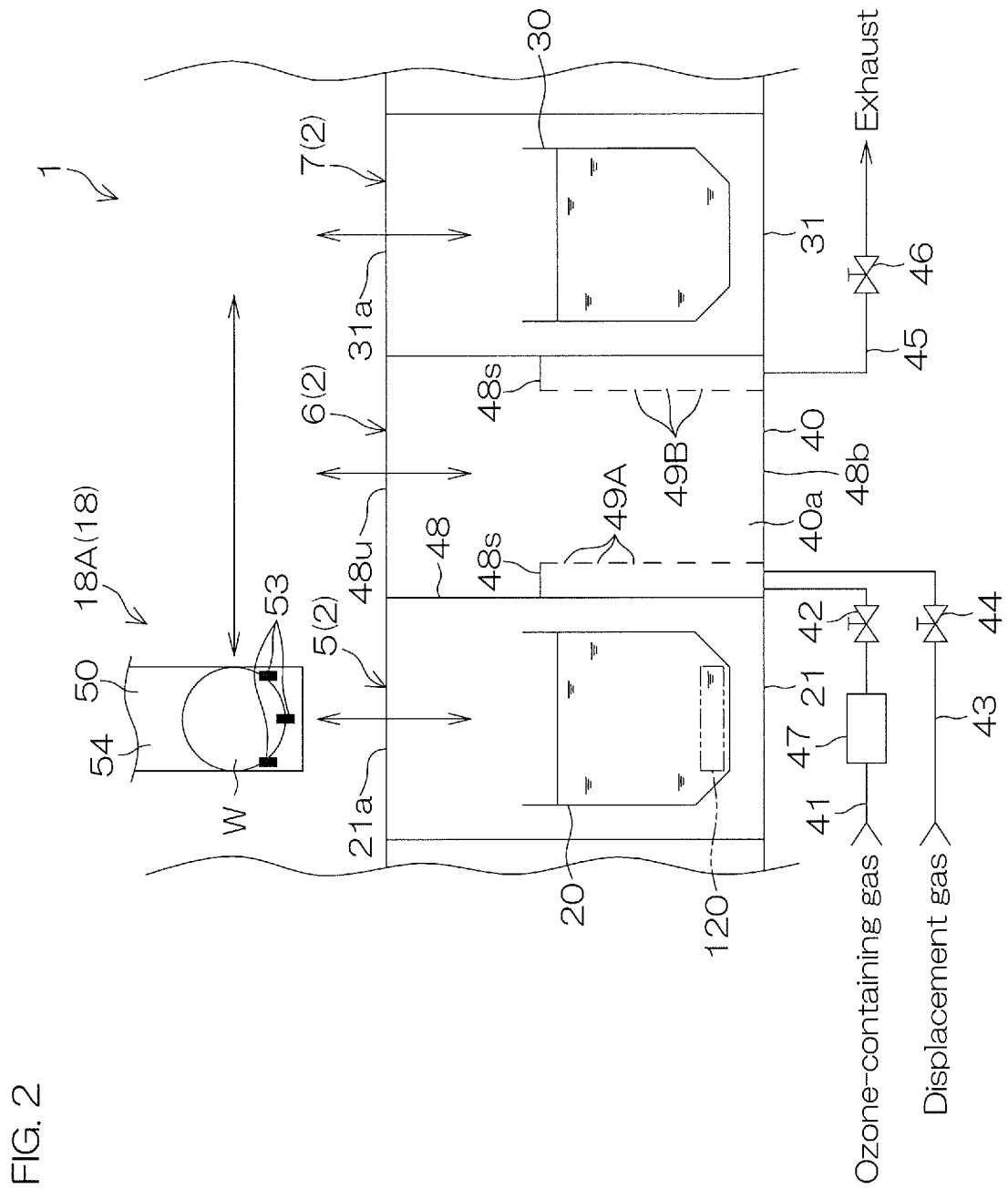
FIG. 2 is a schematic elevational view showing the structures of major portions of the substrate processing apparatus by way of example.

FIG. 2 is a schematic elevational view for describing the structures of major portions of the substrate processing apparatus 1 by way of example.

The sulfuric acid treatment unit 5 includes a sulfuric acid vessel 20 which retains the sulfuric acid-containing liquid in which the single batch of substrates W is immersed, and a sulfuric acid treatment chamber 21 which accommodates the sulfuric acid vessel 20. The sulfuric acid vessel 20 is open upward, and the sulfuric acid treatment chamber 21 has an openable/closable upper end portion 21a.

The first rinsing unit 7 includes a rinse liquid vessel 30 which retains the rinse liquid in which the single batch of substrates W is immersed, and a rinsing chamber 31 which accommodates the rinse liquid vessel 30. The rinse liquid vessel 30 is open upward, and the rinsing chamber 31 has an openable/closable upper end portion 31a.

The ozone gas treatment unit 6 includes a gas treatment chamber 40 in which the single batch of substrates W is exposed to the ozone-containing gas. The gas treatment chamber 40 has a treatment space 40a in which the single batch of substrates W can be accommodated. In the gas treatment chamber 40, the single batch of substrates W accommodated in the treatment space 40a is exposed to the ozone-containing gas.

The ozone gas treatment unit 6 includes an ozone supply flow path 41 which supplies the ozone-containing gas to the gas treatment chamber 40, an ozone gas valve 42 which opens and closes the ozone supply flow path 41, a displacement gas supply flow path 43 which supplies the displacement gas to the gas treatment chamber 40, a displacement gas valve 44 which opens and closes the displacement gas supply flow path 43, an exhaust flow path 45 through which the internal atmosphere of the gas treatment chamber 40 is expelled, and an exhaust valve 46 which opens and closes the exhaust flow path 45.

Though not shown, the ozone gas valve 42 includes a valve body having a valve seat provided therein, a valve member which opens and closes the valve seat, and an actuator which moves the valve member between an open position and a closed position. The other valves each have the same structure.

The ozone supply flow path 41 is defined, for example, by a pipe. The displacement gas supply flow path 43 is defined, for example, by a pipe. The exhaust flow path 45 is defined, for example, by a pipe.

The ozone gas treatment unit 6 includes an ozone flow path heater 47 which heats the ozone-containing gas in the ozone supply flow path 41. The ozone gas treatment unit 6 may include an ozone treatment chamber heater (not shown) which heats the gas treatment chamber 40. The ozone flow path heater 47 and the ozone treatment chamber heater are exemplary ozone heating units which heat the ozone-containing gas in the ozone supply flow path 41 and/or the ozone-containing gas in the gas treatment chamber 40.

The gas treatment chamber 40 has walls 48 defining the treatment space 40a. The walls 48 include an openable/closable upper wall 48u, a bottom wall 48b, and a side wall 48s connecting the upper wall 48u and the bottom wall 48b. The upper wall 48u is openable and closable. The side wall 48s is polygonal or arcuate as seen in plan.

The gas treatment chamber 40 has a plurality of supply orifices 49A which open in the side wall 48s for supplying the ozone-containing gas from the ozone supply flow path 41 into the treatment space 40a, and a plurality of exhaust orifices 49B which open in the side wall 48s for expelling the internal atmosphere of the treatment space 40a. On the side wall 48s, the supply orifices 49A are opposed to the exhaust orifices 49B. The supply orifices 49A are also capable of supplying the displacement gas from the displacement gas supply flow path 43 into the treatment space 40a. The supply orifices 49A are provided in the same number as the exhaust orifices 49B. The supply orifices 49A and the exhaust orifices 49B are, for example, round holes (see FIG. 7 to be described later).

The first auxiliary transport robot 18A transports the single batch of substrates W while holding the single batch of substrates W in the vertical attitude. The first auxiliary transport robot 18A is capable of transporting the single batch of substrates W to the sulfuric acid vessel 20 of the sulfuric acid treatment unit 5 and immersing the single batch of substrates W held in the vertical attitude in the sulfuric acid-containing liquid within the sulfuric acid vessel 20. The first auxiliary transport robot 18A is further capable of transporting the single batch of substrates W into the gas treatment chamber 40 of the ozone gas treatment unit 6 and placing the single batch of substrates W held in the vertical attitude in the treatment space 40a of the gas treatment chamber 40. The first auxiliary transport robot 18A is further capable of transporting the single batch of substrates W into the rinse liquid vessel 30 of the first rinsing unit 7 and immersing the single batch of substrates W held in the vertical attitude in the rinse liquid within the rinse liquid vessel 30.

<Structure of First Auxiliary Transport Robot>

Figure 3:
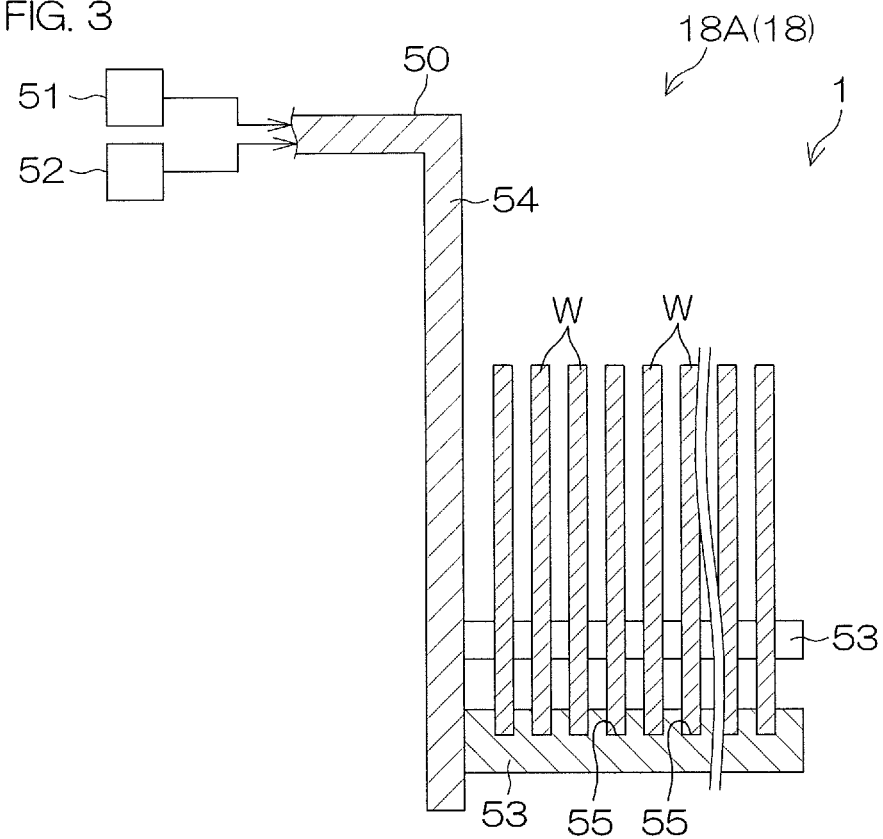
FIG. 3 is a sectional view for describing the structure of an auxiliary transport robot provided in the substrate processing apparatus by way of example.

FIG. 3 is a sectional view for describing the structure of the first auxiliary transport robot 18A provided in the substrate processing apparatus 1 by way of example.

The first auxiliary transport robot 18A includes a lifter 50 which supports the single batch of substrates W, a lifting mechanism 51 which moves up and down the lifter 50, and a sliding mechanism 52 which horizontally moves (slides) the lifter 50.

The lifting mechanism 51 includes a lifting actuator (not shown) which generates a driving force for moving up and down the lifter 50. The lifting actuator is, for example, an electric motor or an air cylinder. The lifting mechanism 51 may include a power transmission mechanism (not shown) which transmits the driving force of the lifting actuator to the lifter 50. The power transmission mechanism includes at least one of a ball screw mechanism and a rack-and-pinion mechanism, for example.

The sliding mechanism 52 includes a sliding actuator (not shown) which generates a driving force for horizontally moving the lifter 50. The sliding actuator is, for example, an electric motor or an air cylinder. The sliding mechanism 52 may include a power transmission mechanism (not shown) which transmits the driving force of the sliding actuator to the lifter 50.

The lifter 50 is not particularly limited but, for example, has the following structure. The lifter 50 includes a plurality of support portions 53 (e.g., three support portions 53) (also see FIG. 2) which support the single batch of substrates W from below, and a connection portion 54 which connects the support portions 53 to each other at one-side ends thereof.

The support portions 53 each have support grooves 55 of the same number as that of the substrates W to be supported. In FIG. 3, only the support grooves 55 of a middle one of the three support portions 53 are shown. In each of the support portions 53, the support grooves 55 are provided equidistantly in an arrangement direction (horizontal direction) in which the substrates W in the single batch are arranged. Peripheral edge portions of the substrates W are respectively held in the support grooves 55 located at the corresponding positions with respect to the arrangement direction. Therefore, the lifter 50 is capable of moving up and down the single batch of substrates W while maintaining the single batch of substrates W in the vertical attitude.

Referring to FIG. 2, the lifter 50 of the first auxiliary transport robot 18A is horizontally movable above the gas treatment chamber 40, the sulfuric acid treatment chamber 21, and the rinsing chamber 31. The lifter 50 of the first auxiliary transport robot 18A can be horizontally moved among a first upper position just above the sulfuric acid treatment chamber 21, a second upper position just above the gas treatment chamber 40, and a third upper position just above the rinsing chamber 31 by the sliding mechanism 52.

The lifter 50 of the first auxiliary transport robot 18A can be moved up and down between the first upper position and a sulfuric acid treatment position where the single batch of substrates W is immersed in the sulfuric acid-containing liquid within the sulfuric acid vessel 20 by the lifting mechanism 51. The lifter 50 of the first auxiliary transport robot 18A can be moved up and down between the second upper position and a gas treatment position where the single batch of substrates W is placed in the treatment space 40a by the lifting mechanism 51. The lifter 50 of the first auxiliary transport robot 18A can be moved up and down between the third upper position and a rinsing position where the single batch of substrates W is immersed in the rinse liquid within the rinse liquid vessel 30 by the lifting mechanism 51.

The sulfuric acid treatment position is such that the upper edge portions of the substrates W supported in the vertical attitude are located below the liquid surface of the sulfuric acid-containing liquid in the sulfuric acid vessel 20. The rinsing position is such that the upper edge portions of the substrates W supported in the vertical attitude are located below the liquid surface of the rinse liquid in the rinse liquid vessel 30.

<Electrical Configuration of Substrate Processing Apparatus>

Figure 4:
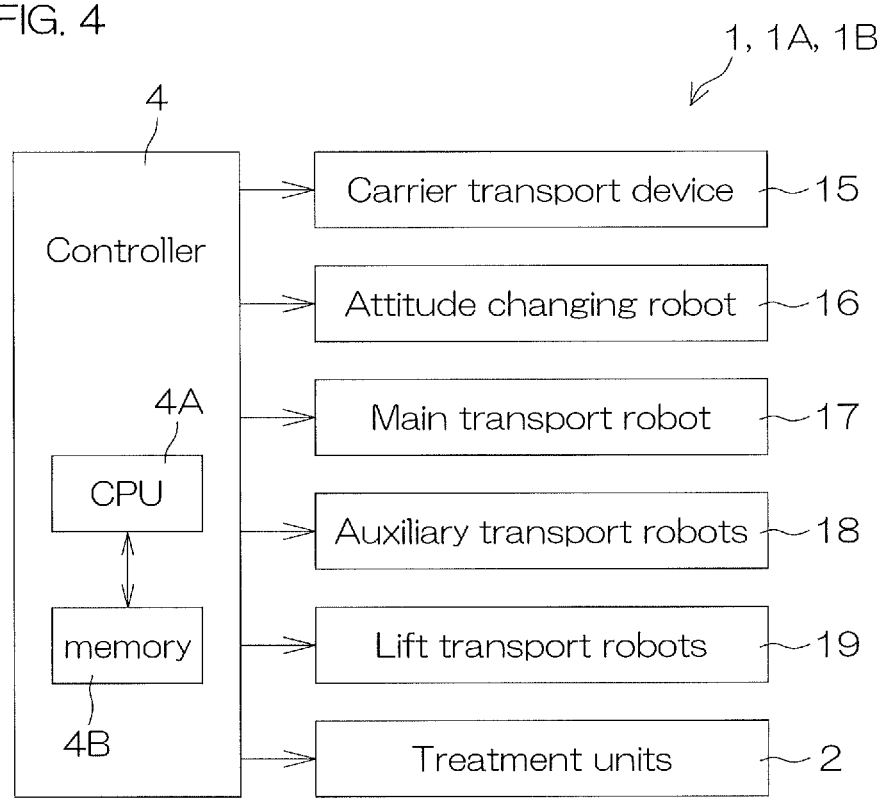
FIG. 4 is a block diagram for describing the electrical configuration of the substrate processing apparatus by way of example.

FIG. 4 is a block diagram for describing the electrical configuration of the substrate processing apparatus 1 by way of example.

The controller 4 includes a microcomputer, and controls control objects provided in the substrate processing apparatus 1 according to a predetermined program. More specifically, the controller 4 includes a processor (CPU) 4A and a memory 4B which stores the program. The controller 4 is configured so that the processor 4A executes the program to perform various control operations for a substrate treatment.

Particularly, the controller 4 controls the operations of the carrier transport device 15, the attitude changing robot 16, the main transport robot 17, the auxiliary transport robots 18, the treatment units 2, and the like. The controller 4 further controls the valves and the heaters provided in the treatment units 2.

<Exemplary Substrate Treatment>

Figure 5:
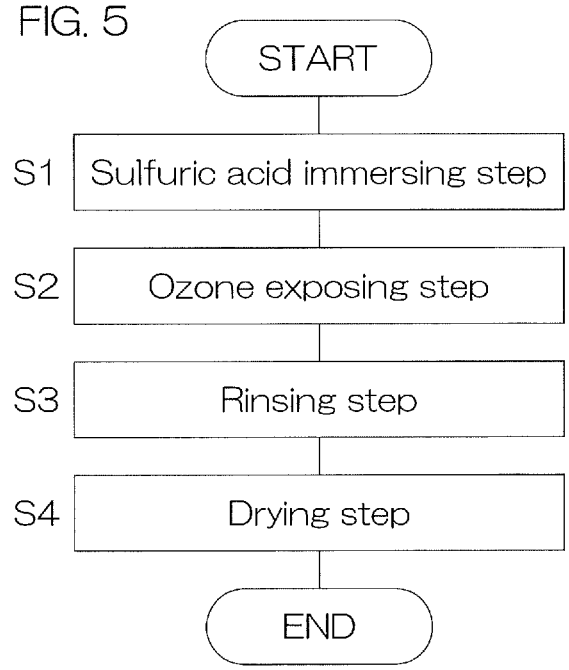
FIG. 5 is a flow chart for describing an exemplary substrate treatment to be performed by the substrate processing apparatus.
Figure 6A:
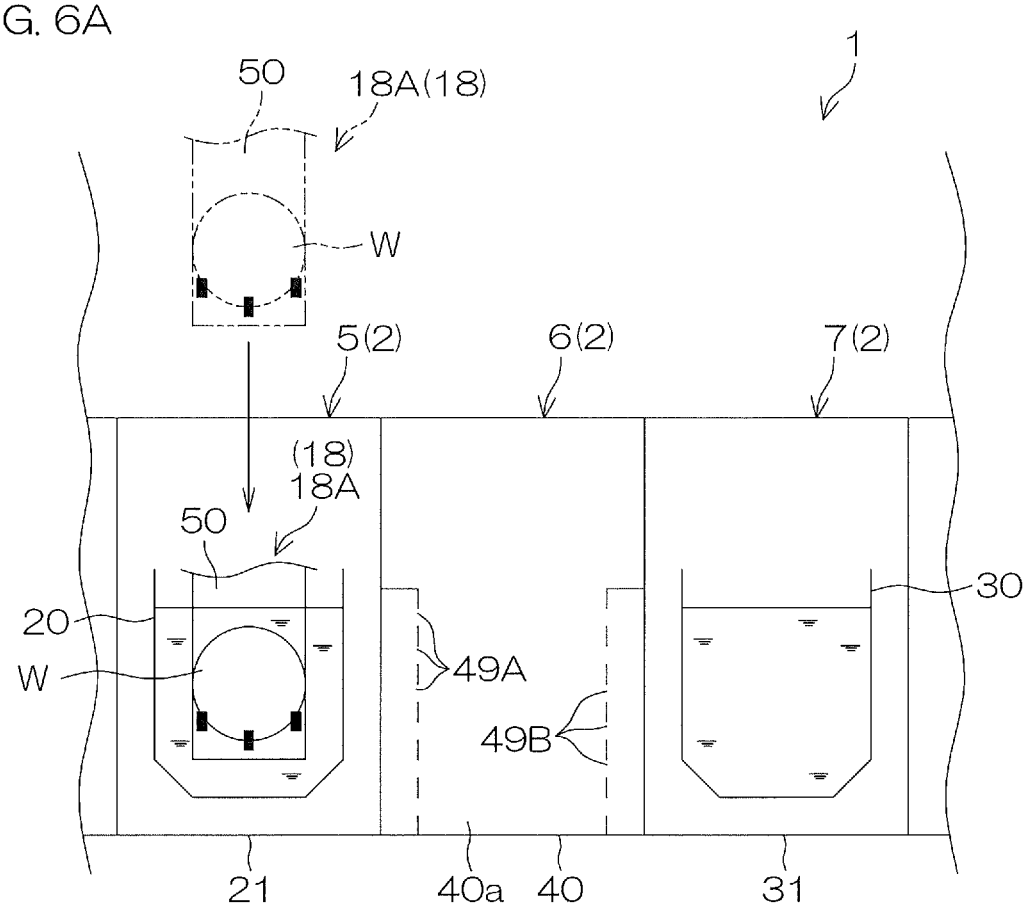
Figure 6B:
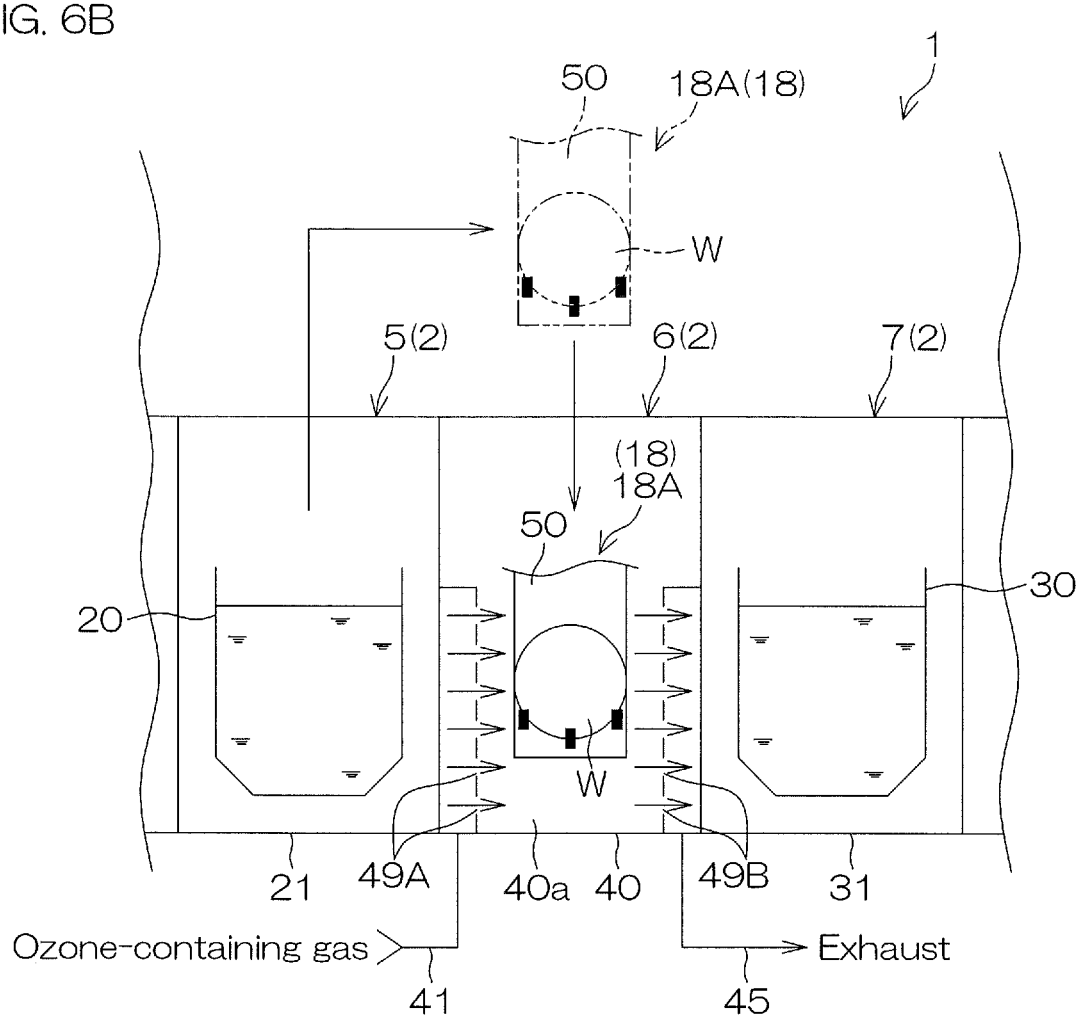

FIG. 5 is a flow chart for describing an example of the substrate treatment to be performed by the substrate processing apparatus 1. FIGS. 6A to 6C are schematic diagrams for describing how the substrate processing apparatus 1 performs the substrate treatment.

In the substrate treatment, the substrate processing apparatus 1 performs, for example, a sulfuric acid immersing step (Step S1), an ozone exposing step (Step S2), a rinsing step (Step S3) and a drying step (Step S4) as shown in FIG. 5. The substrate treatment will hereinafter be described in detail mainly with reference to FIGS. 1, 2 and 5. As required, reference will be made to FIGS. 6A to 6C.

The main transport robot 17 receives a single batch of substrates W from the attitude changing robot 16. The main transport robot 17 transfers the single batch of substrates W received from the attitude changing robot 16 to the first auxiliary transport robot 18A. The single batch of substrates W is supported by the lifter 50 of the first auxiliary transport robot 18A.

After the first auxiliary transport robot 18A receives the single batch of substrates W from the main transport robot 17, the lifter 50 is moved to the first upper position (indicated by a two-dot-and-dash line in FIG. 6A). The lifter 50 may receive the single batch of substrates W from the main transport robot 17 at the first upper position.

The lifter 50 is moved down from the first upper position (indicated by the two-dot-and-dash line in FIG. 6A) toward the sulfuric acid treatment position (indicated by a solid line in FIG. 6A) while supporting the single batch of substrates W in the vertical attitude. Thus, as shown in FIG. 6A, the single batch of substrates W is immersed in the sulfuric acid-containing liquid within the sulfuric acid vessel 20 while being held in the vertical attitude (sulfuric acid immersing step: Step S1).

Thereafter, the lifter 50 is moved up toward the first upper position, whereby the single batch of substrates W is taken out from the sulfuric acid-containing liquid in the sulfuric acid vessel 20. The lifter 50 is moved to the second upper position (indicated by a two-dot-and-dash line in FIG. 6B) through the first upper position. Then, the lifter 50 is moved down from the second upper position to the gas treatment position (indicated by a solid line in FIG. 6B). In this manner, a first transporting step (transporting step) is performed to take out the single batch of substrates W from the sulfuric acid vessel 20 and then transport the single batch of substrates W to the gas treatment chamber 40.

With the lifter 50 located at the gas treatment position, the ozone gas valve 42 and the exhaust valve 46 are opened. Thus, the internal atmosphere of the treatment space 40a is expelled from the gas treatment chamber 40, and the ozone-containing gas is supplied into the treatment space 40a. By thus supplying the ozone-containing gas into the treatment space 40a, the single batch of substrates W to which the sulfuric acid-containing liquid adheres is exposed to the ozone-containing gas (ozone exposing step: Step S2 (vertical exposing step)).

When the substrates W to which the sulfuric acid-containing liquid adheres are exposed to the ozone-containing gas, the ozone in the ozone-containing gas is dissolved in the adhering sulfuric acid-containing liquid, whereby peroxodisulfuric acid is generated in the adhering sulfuric acid-containing liquid. The peroxodisulfuric acid makes it possible to dissolve organic films exposed from the substrates W in the sulfuric acid-containing liquid. Parts of the organic films are not completely dissolved in the sulfuric acid-containing liquid, but are often separated from upper surfaces of the substrates W.

By supplying the ozone-containing gas into the treatment space 40a, the internal atmosphere of the treatment space 40a is preferably replaced with the ozone-containing gas, whereby the treatment space 40a is filled with the ozone-containing gas (ozone-containing gas filling step). With the treatment space 40a filled with the ozone-containing gas, the peroxodisulfuric acid can be speedily and sufficiently generated in the sulfuric acid-containing liquid.

The temperature of the ozone-containing gas is preferably, for example, in a range of not lower than 50° C. and not higher than 270° C. The temperature of the ozone-containing gas is preferably in a range of not lower than 50° C. and not higher than 270° C., more preferably in a range of not lower than 80° C. and not higher than 170° C. This enhances the activity of the peroxodisulfuric acid, making it possible to speedily remove the organic films.

Figure 7:
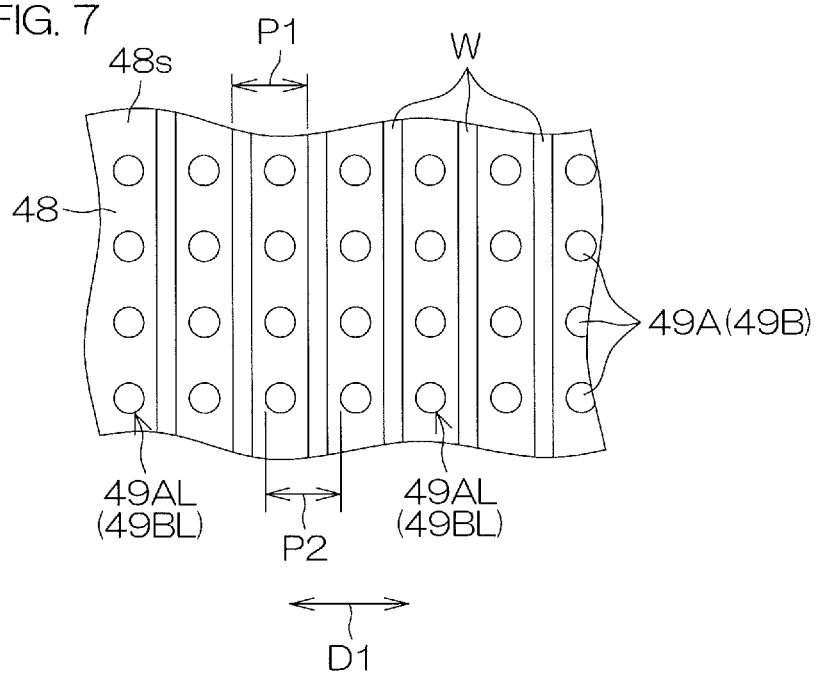
FIG. 7 is a diagram of a wall of a gas treatment chamber as seen from a treatment space of the gas treatment chamber when a lifter is located at a gas treatment position.

In the gas treatment chamber 40, as shown in FIG. 7, the supply orifices 49A are arranged in a plurality of supply orifice rows 49AL juxtaposed in a first arrangement direction D1 (horizontally). More specifically, the supply orifice rows 49AL each include a plurality of supply orifices 49A aligned in a predetermined row direction (vertically in this example). The first arrangement direction D1 intersects the row direction (orthogonally in this example). The substrates W in the single batch supported by the lifter 50 are arranged horizontally. The arrangement pitch P1 of the substrates W in the single batch is equal to the arrangement pitch P2 of the supply orifice rows 49AL. When the lifter 50 supports the single batch of substrates W in the vertical attitude and, in this state, is located at the gas treatment position, the substrates W are located between respective adjacent pairs of the supply orifice rows 49AL as seen in a horizontal direction parallel to the major surfaces of the substrates W.

In FIG. 7, the reference character "49A" for the supply orifices and the reference character "49B" for the exhaust orifices are both shown for convenience of description. The exhaust orifices 49B are provided in the same arrangement as the supply orifices 49A. In the gas treatment chamber 40, the exhaust orifices 49B are arranged in a plurality of exhaust orifice rows 49BL juxtaposed at the same arrangement pitch P2 as the supply orifice rows 49AL in the first arrangement direction D1 (horizontally). The exhaust orifice rows 49BL each include a plurality of exhaust orifices 49B aligned in a predetermined row direction (vertically in this embodiment). The first arrangement direction D1 intersects the row direction (orthogonally in this example). When the lifter 50 supports the single batch of substrates W in the vertical attitude and, in this state, is located at the gas treatment position, the substrates W are located between respective adjacent pairs of the exhaust orifice rows 49BL as seen in a horizontal direction parallel to the major surfaces of the substrates W.

Thereafter, the lifter 50 is moved up toward the second upper position, whereby the single batch of substrates W is taken out from the gas treatment chamber 40. The lifter 50 is moved to the third upper position (indicated by a two-dot-and-dash line in FIG. 6C) through the second upper position. Then, the lifter 50 is moved down from the third upper position toward the rinsing position (indicated by a solid line in FIG. 6C). Thus, as shown in FIG. 6C, the single batch of substrates W is immersed in the rinse liquid within the rinse liquid vessel 30 (rinsing step: Step S3). In this manner, a second transporting step is performed to take out the single batch of substrates W from the gas treatment chamber 40 and then transport the single batch of substrates W into the rinse liquid vessel 30.

By thus immersing the single batch of substrates W in the rinse liquid within the rinse liquid vessel 30, the single batch of substrates W is rinsed. Specifically, the sulfuric acid-containing liquid in which the organic films are dissolved and the organic films separated from the substrates W are removed from the substrates W.

After the single batch of substrates W is taken out from the gas treatment chamber 40, the ozone gas valve 42 is closed, and the displacement gas valve 44 is opened. Thus, the displacement gas is supplied into the treatment space 40a of the gas treatment chamber 40, whereby the internal atmosphere of the treatment space 40a is replaced with the displacement gas. In this manner, the ozone-containing gas is expelled from the treatment space 40a (ozone expelling step).

Thereafter, the lifter 50 is moved up toward the third upper position. Thus, the single batch of substrates W is taken out from the rinse liquid in the rinse liquid vessel 30. With the lifter 50 located at the third upper position, the first auxiliary transport robot 18A transfers the single batch of substrates W to the main transport robot 17. The main transport robot 17 transports the single batch of substrates W received from the first auxiliary transport robot 18A to the drying unit 10.

In the drying unit 10, the single batch of substrates W is dried by a reduced pressure drying method or the like (drying step: Step S4). Thereafter, the main transport robot 17 transfers the single batch of substrates W to the attitude changing robot 16. The attitude changing robot 16 changes the attitude of the single batch of substrates W received from the main transport robot 17 from the vertical attitude to the horizontal attitude, and then places the substrates W of the single batch in a plurality of carriers C held in the carrier transport device 15. This operation sequence is repeated, whereby a plurality of substrates W transported into the substrate processing apparatus 1 are treated.

According to the first embodiment, the single batch of substrates W can be immersed in the sulfuric acid-containing liquid while being held in the vertical attitude. Therefore, the substrates W can be generally simultaneously immersed in the sulfuric acid-containing liquid. The single batch of substrates W immersed in the sulfuric acid-containing liquid at a time is exposed to the ozone-containing gas in the ozone gas treatment unit 6. Thus, the ozone in the ozone-containing gas is dissolved in the sulfuric acid-containing liquid adhering to the substrates W in the single batch taken out from the sulfuric acid-containing liquid, whereby the peroxodisulfuric acid can be generated in the adhering sulfuric acid-containing liquid. As a result, the organic films can be speedily and sufficiently removed from the major surfaces of the substrates W in the single batch.

According to the first embodiment, the single batch of substrates W taken out from the sulfuric acid vessel 20 is placed in the treatment space 40a of the gas treatment chamber 40. Thus, the substrates W in the single batch can be generally simultaneously exposed to the ozone-containing gas. Therefore, the organic films can be more speedily and sufficiently removed from the major surfaces of the substrates W in the single batch.

According to the first embodiment, the ozone-containing gas is supplied from the supply orifices 49A into the treatment space 40a, and is expelled from the treatment space 40a through the exhaust orifices 49B, whereby the single batch of substrates W can be exposed to the ozone-containing gas. Therefore, even if ozone in the atmosphere in contact with the sulfuric acid-containing liquid on the substrates W is dissolved in the sulfuric acid-containing liquid to be thereby consumed, ozone is supplied to the atmosphere in contact with the sulfuric acid-containing liquid adhering to the substrates W by supplying the ozone-containing gas into the treatment space 40a. Therefore, the ozone concentration of the atmosphere in contact with the sulfuric acid-containing liquid on the substrates W can be maintained at a sufficiently high level. This makes it possible to generate the peroxodisulfuric acid in the sulfuric acid-containing liquid on the substrates W.

In the gas treatment chamber 40, the supply orifice rows 49AL are juxtaposed in the first arrangement direction D1. The substrates W in the single batch are supported by the lifter 50 so as to be arranged in the first arrangement direction D1. The single batch of substrates W is placed in the treatment space 40a so that the substrates W are located between respective adjacent pairs of the supply orifice rows 49AL. Therefore, the ozone-containing gas from the supply orifice rows 49AL can be supplied between respective adjacent pairs of the substrates W. Thus, the ozone can be sufficiently supplied into the atmosphere in contact with the sulfuric acid-containing liquid on the substrates W, and sufficiently dissolved in the sulfuric acid-containing liquid on the substrates W. As a result, it is possible to suppress the uneven removal of the organic films from the substrates W.

Figure 8:
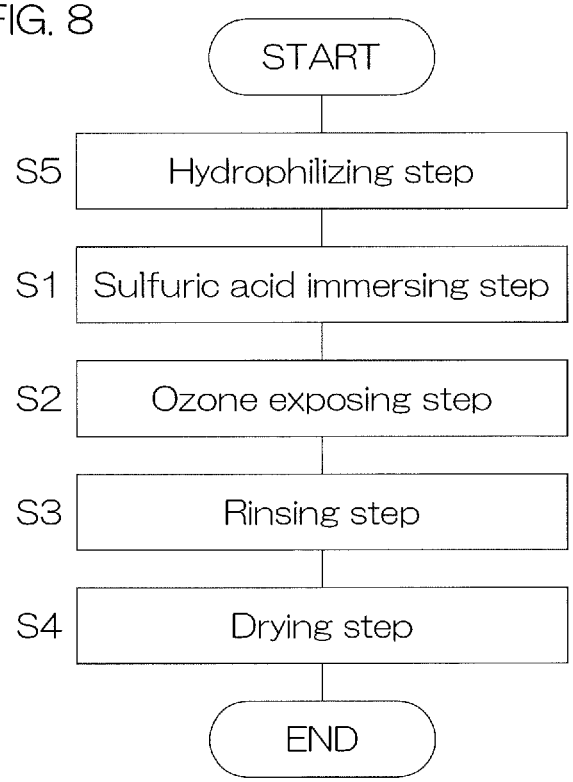
FIG. 8 is a flow chart for describing another exemplary substrate treatment.

Before the sulfuric acid immersing step (Step S1), the single batch of substrates W may be loaded into the gas treatment chamber 40 and exposed to the ozone-containing gas to be thereby hydrophilized. That is, as shown in FIG. 8, the substrate treatment may further include a hydrophilizing step (Step S5) to be performed before the sulfuric acid immersing step (Step S1). In the substrate treatment, the single batch of substrates W is exposed to the ozone-containing gas before and after being immersed in the sulfuric acid-containing liquid. By performing the substrate treatment as shown in FIG. 8, the single batch of substrates W is hydrophilized before being immersed in the sulfuric acid-containing liquid.

This improves the wettability of the substrates W, so that the sulfuric acid-containing liquid can easily adhere to the substrates W. Therefore, the sulfuric acid-containing liquid can be thinly spread over the entire major surfaces of the substrates W. In the ozone exposing step, the ozone can easily reach the major surfaces of the substrates W, making it possible to speedily and sufficiently remove the organic films from the major surfaces of the substrates W.

<First Modification of First Embodiment>

Next, a first modification of the substrate processing apparatus 1 will be described.

Figure 9:
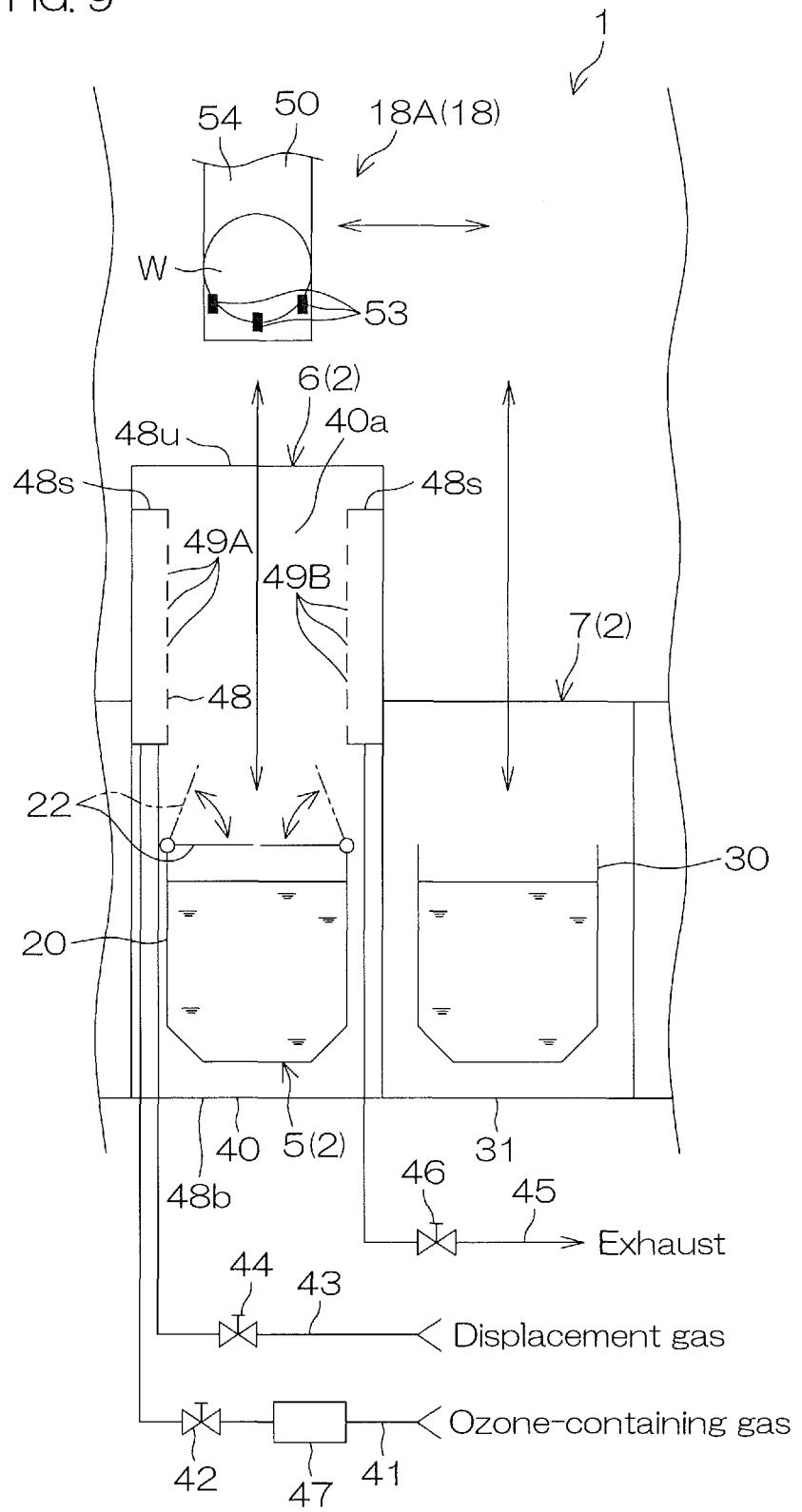
FIG. 9 is an elevational view of major portions of a substrate processing apparatus according to a first modification of the first embodiment.

FIG. 9 is an elevational view of major portions of the substrate processing apparatus 1 according to the first modification of the first embodiment.

In the first modification, the sulfuric acid treatment chamber 21 is not provided, but the sulfuric acid vessel 20 is disposed in the gas treatment chamber 40. In the gas treatment chamber 40, the treatment space 40a is located just above the sulfuric acid vessel 20.

The first auxiliary transport robot 18A is movable up and down while supporting the substrates W so as to transport the substrates W between the treatment space 40a and the sulfuric acid vessel 20. The sulfuric acid treatment unit 5 does not have the sulfuric acid treatment chamber 21, but includes a cover member 22 which covers and uncovers the sulfuric acid vessel 20 to separate the inside of the sulfuric acid vessel 20 and the treatment space 40a from each other. In the first modification, the treatment space 40a is defined by the side wall 48s, the upper wall 48u and the cover member 22. The cover member 22 is driven by a cover driving mechanism such as a motor (not shown) to cover and uncover the sulfuric acid vessel 20.

The lifter 50 of the first auxiliary transport robot 18A is horizontally movable above the gas treatment chamber 40 and the rinsing chamber 31. The lifter 50 can be horizontally moved between the second upper position just above the gas treatment chamber 40 and the third upper position just above the rinsing chamber 31 by the sliding mechanism 52. The lifter 50 can be moved up and down among the sulfuric acid treatment position, the gas treatment position and the second upper position by the lifting mechanism 51. The lifter 50 can be moved up and down between the rinsing position and the third upper position by the lifting mechanism 51.

Figure 10B:
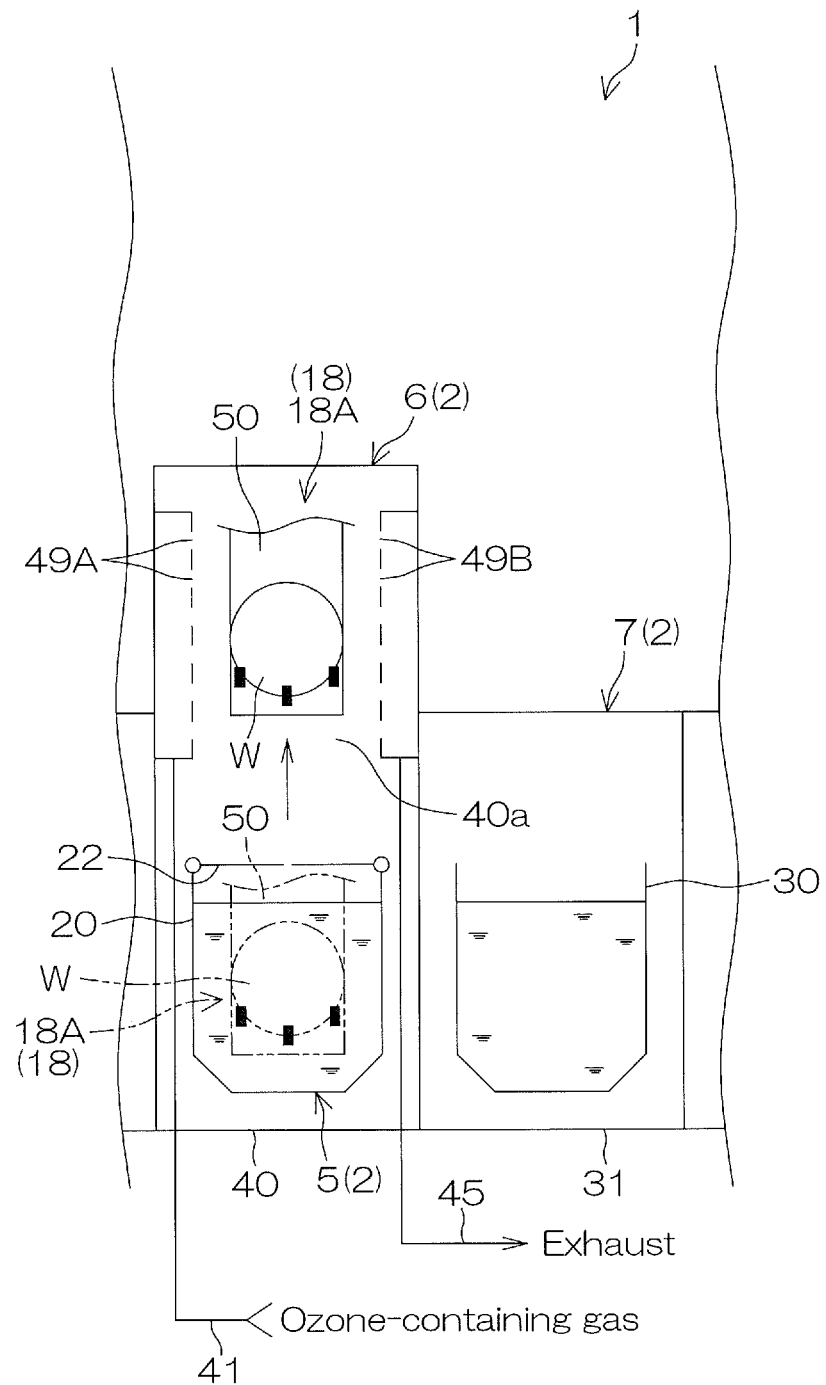
Figure 10C:
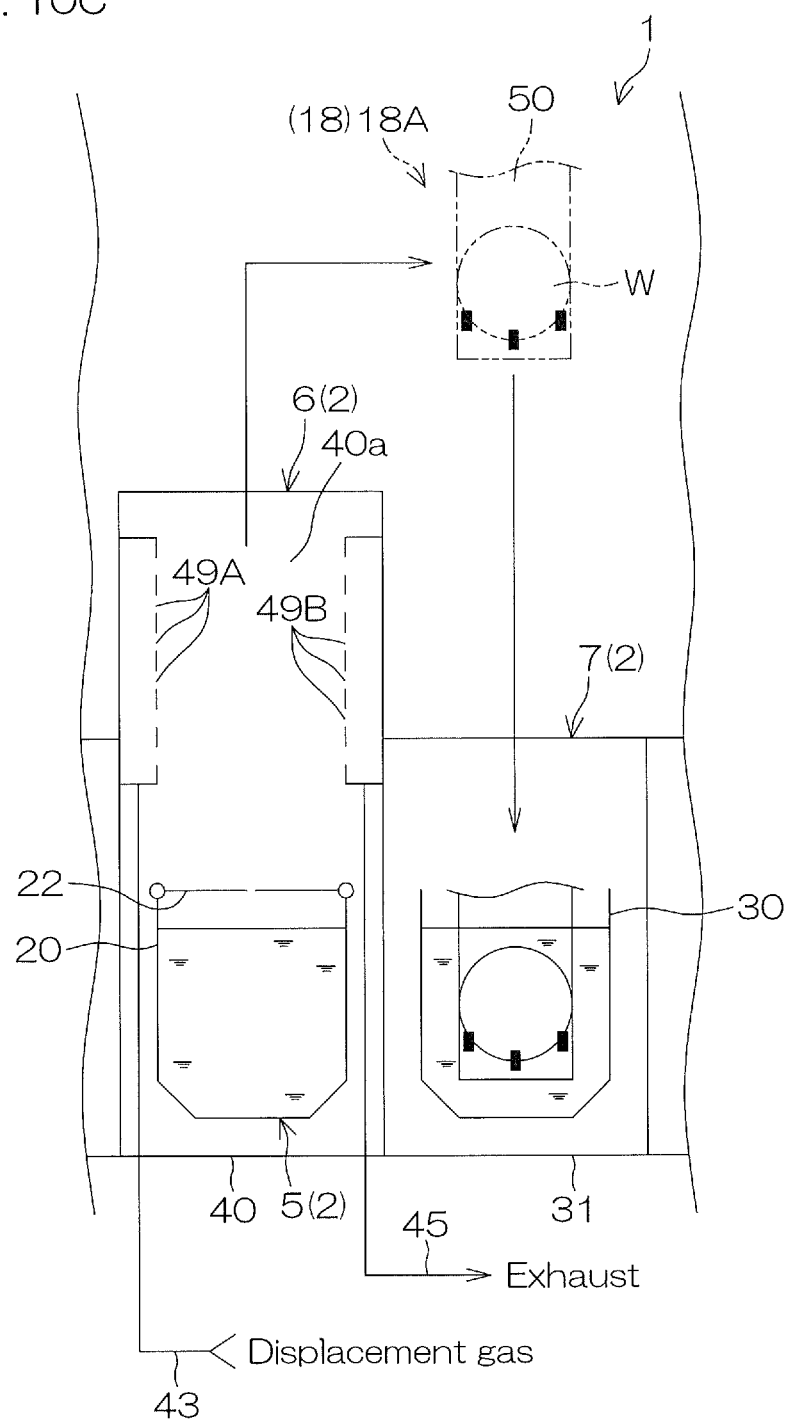

FIGS. 10A to 10C are schematic diagrams for describing how the substrate processing apparatus 1 of the first modification performs the substrate treatment.

The substrate processing apparatus 1 of the first modification is capable of performing the substrate treatment shown in FIG. 5, but performs the substrate treatment by a different procedure from that shown in FIGS. 6A to 6C. Differences will hereinafter be mainly described.

In the substrate treatment according to the first modification, the lifter 50 receives the single batch of substrates W from the main transport robot 17, and then is moved to the second upper position (indicated by a two-dot-and-dash line in FIG. 10A). The lifter 50 is moved down toward the sulfuric acid treatment position (indicated by a solid line in FIG. 10A) while supporting the single batch of substrates W. Thus, as shown in FIG. 10A, the single batch of substrates W is immersed in the sulfuric acid-containing liquid within the sulfuric acid vessel 20 (sulfuric acid immersing step: Step S1 in FIG. 5). The cover member 22 is opened before the lifter 50 is moved into the sulfuric acid vessel 20.

Thereafter, the lifter 50 is moved upward, whereby the single batch of substrates W is taken out from the sulfuric acid-containing liquid in the sulfuric acid vessel 20. The lifter 50 is moved up from the sulfuric acid treatment position (indicated by a two-dot-and-dash line in FIG. 10B) to the gas treatment position (indicated by a solid line in FIG. 10B). Thus, the single batch of substrates W is lifted from the sulfuric acid vessel 20 to be thereby placed in the treatment space 40a (first transporting step). After the lifter 50 is retracted from the sulfuric acid vessel 20, the cover member 22 is closed.

With the lifter 50 located at the gas treatment position, the ozone gas valve 42 and the exhaust valve 46 are opened. Thus, the internal atmosphere of the treatment space 40a is expelled from the gas treatment chamber 40, and the ozone-containing gas is supplied into the treatment space 40a. By thus supplying the ozone-containing gas into the treatment space 40a, therefore, the single batch of substrates W to which the sulfuric acid-containing liquid adheres is exposed to the ozone-containing gas (ozone exposing step: Step S2 in FIG. 5).

The substrates W to which the sulfuric acid-containing liquid adheres are thus exposed to the ozone-containing gas, whereby the ozone in the ozone-containing gas is dissolved in the sulfuric acid-containing liquid adhering to the substrates W. Thus, the peroxodisulfuric acid is generated in the sulfuric acid-containing liquid adhering to the substrates W in the single batch. The peroxodisulfuric acid makes it possible to dissolve the organic films exposed from the substrates W in the sulfuric acid-containing liquid. Parts of the organic films are not completely dissolved in the sulfuric acid-containing liquid, but are often separated from the upper surfaces of the substrates W.

By supplying the ozone-containing gas into the treatment space 40a, the internal atmosphere of the treatment space 40a is preferably replaced with the ozone-containing gas, whereby the treatment space 40a is filled with the ozone-containing gas (ozone-containing gas filling step). In the first modification, when the lifter 50 is located at the gas treatment position, the substrates W are located between respective adjacent pairs of the supply orifice rows 49AL (see FIG. 7).

Thereafter, the lifter 50 is moved up toward the second upper position, whereby the single batch of substrates W is taken out from the gas treatment chamber 40. The lifter 50 is moved to the third upper position (indicated by a two-dot-and-dash line in FIG. 10C) through the second upper position. Then, the lifter 50 is moved down toward the rinsing position (indicated by a solid line in FIG. 10C) from the third upper position. Thus, as shown in FIG. 10C, the single batch of substrates W is immersed in the rinse liquid within the rinse liquid vessel 30 (rinsing step: Step S3 in FIG. 5). In this manner, the second transporting step is performed to take out the single batch of substrates W from the gas treatment chamber 40 and then transport the single batch of substrates W to the rinse liquid vessel 30.

By thus immersing the single batch of substrates W in the rinse liquid within the rinse liquid vessel 30, the single batch of substrates W is rinsed. More specifically, the sulfuric acid-containing liquid in which the organic films are dissolved and the organic films separated from the substrates W are removed from the substrates W.

After the single batch of substrates W is taken out from the gas treatment chamber 40, the ozone gas valve 42 is closed and the displacement gas valve 44 is opened. Thus, the displacement gas is supplied into the treatment space 40a of the gas treatment chamber 40, whereby the internal atmosphere of the treatment space 40a is replaced with the displacement gas. Thus, the ozone-containing gas is expelled from the treatment space 40a.

Thereafter, the drying step (Step S4) is performed in the same manner as in the substrate treatment procedure shown in FIGS. 6A to 6C.

According to the first modification of the first embodiment, the single batch of substrates W is lifted from the sulfuric acid vessel 20 by the unidirectional movement to be thereby moved from the sulfuric acid vessel 20 into the treatment space 40a. Therefore, the single batch of substrates W can be speedily exposed to the ozone-containing gas after the sulfuric acid-containing liquid is applied to the single batch of substrates W. Thus, the organic films can be speedily removed from the major surfaces of the substrates W in the single batch.

The inside of the sulfuric acid vessel 20 and the treatment space 40a are separated from each other by the cover member 22 which covers and uncovers the sulfuric acid vessel 20. Thus, the ozone-containing gas is substantially prevented from being dissolved in the sulfuric acid-containing liquid retained in the sulfuric acid vessel 20. In the substrate treatment of the next batch of substrates W, therefore, the removal of the organic films from the substrates W can be suppressed before the start of the supply of the ozone-containing gas into the treatment space 40a. This suppresses variations in peroxodisulfuric acid treatment period from batch to batch.

<Second Modification of First Embodiment>

Next, a second modification of the substrate processing apparatus 1 will be described.

Figure 11:
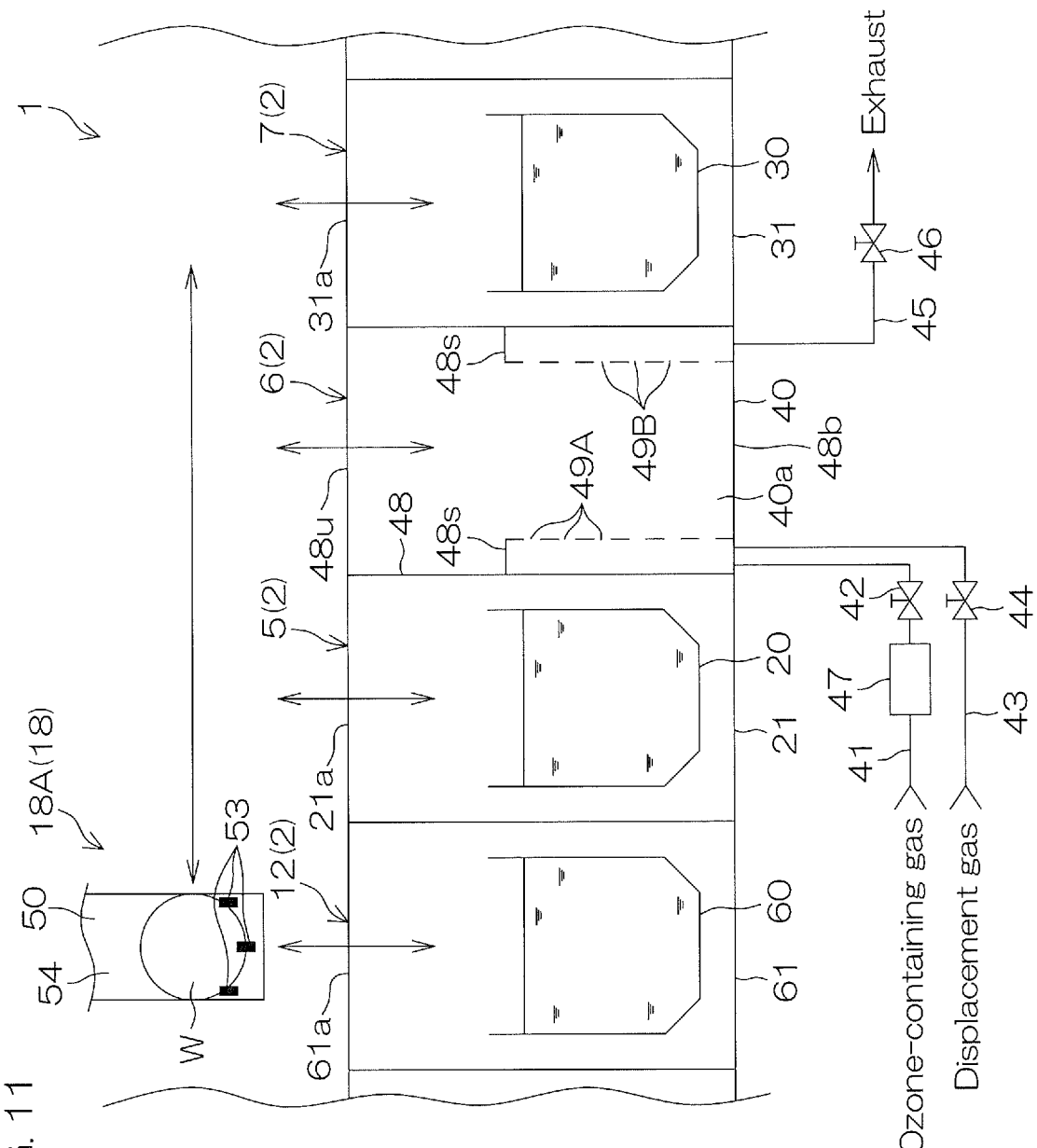
FIG. 11 is an elevational view of major portions of a substrate processing apparatus according to a second modification of the first embodiment.

FIG. 11 is an elevational view of major portions of the substrate processing apparatus 1 of the second modification of the first embodiment.

In the second modification, the substrate processing apparatus 1 further includes a hydrophilizing unit 12 which treats the single batch of substrates W with a hydrophilizing liquid. The hydrophilizing liquid is, for example, ozone water.

The hydrophilizing unit 12 includes a hydrophilizing liquid vessel 60 which retains the hydrophilizing liquid in which the single batch of substrates W is immersed, and a hydrophilizing chamber 61 which accommodates the hydrophilizing liquid vessel 60. The hydrophilizing liquid vessel 60 is open upward, and the hydrophilizing chamber 61 has an openable/closable upper end portion 61a.

The lifter 50 of the first auxiliary transport robot 18A is horizontally movable above the gas treatment chamber 40, the sulfuric acid treatment chamber 21, the rinsing chamber 31 and the hydrophilizing chamber 61. The lifter 50 can be moved among the first upper position, the second upper position, the third upper position, and a fourth upper position just above the hydrophilizing chamber 61 by the sliding mechanism 52.

The substrate processing apparatus 1 of the second modification is capable of performing the substrate treatment shown in FIG. 5. The substrate processing apparatus 1 of the second modification is also capable of performing the substrate treatment shown in FIG. 8.

Where the substrate treatment shown in FIG. 8 is performed, the first auxiliary transport robot 18A receives the single batch of substrates W from the main transport robot 17, and then the lifter 50 is moved to the fourth upper position. The lifter 50 is moved down toward a hydrophilizing position while supporting the single batch of substrates W. Thus, the single batch of substrates W is immersed in the hydrophilizing liquid within the hydrophilizing liquid vessel 60 (hydrophilizing step: Step S5).

Thereafter, the single batch of substrates W is taken out from the hydrophilizing liquid vessel 60, and a process sequence from the sulfuric acid immersing step (Step S1) to the drying step (Step S4) is performed in the same manner as in the substrate treatment procedure shown in FIGS. 6A to 6C.

According to the second modification of the first embodiment, the single batch of substrates W can be hydrophilized before being immersed in the sulfuric acid-containing liquid. This improves the wettability of the substrates W, so that the sulfuric acid-containing liquid can easily adhere to the substrates W. Therefore, the sulfuric acid-containing liquid can be thinly spread over the entire major surfaces of the substrates W. In the ozone exposing step, therefore, the ozone can easily reach the major surfaces of the substrates W, making it possible to speedily and sufficiently remove the organic films from the substrates W.

<Structure of Substrate Processing Apparatus According to Second Embodiment>

Figure 12A:
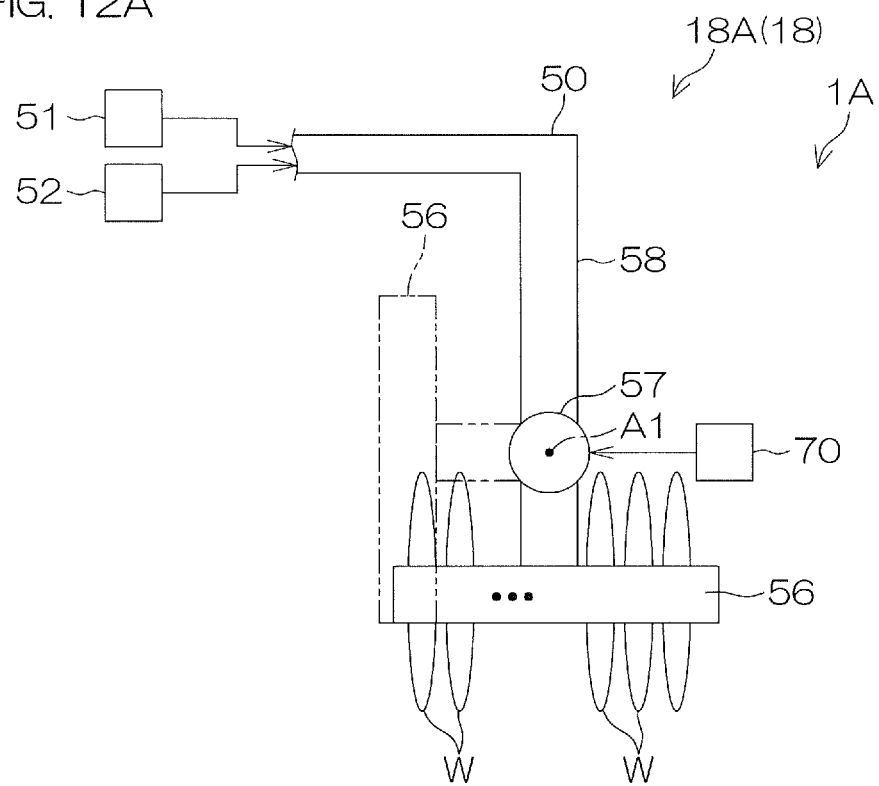
FIGS. 12A and 12B are schematic diagrams showing the structure of a first auxiliary transport robot provided in a substrate processing apparatus according to a second embodiment by way of example, specifically illustrating a state in which a lifter supports a single batch of substrates in a vertical attitude and a state in which the lifter supports the single batch of substrates in a horizontal attitude, respectively.
Figure 12B:
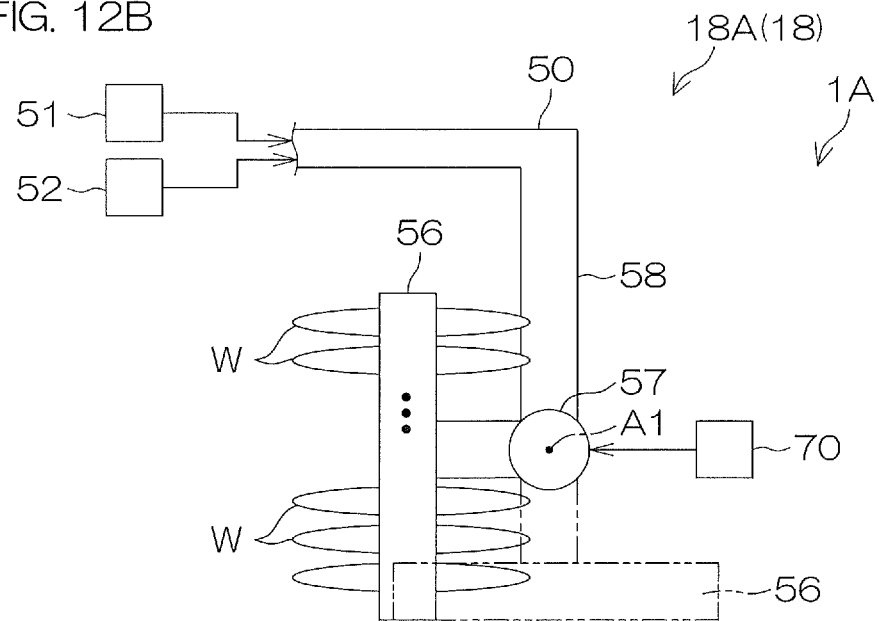

Next, a substrate processing apparatus 1A according to a second embodiment will be described by way of example. FIGS. 12A and 12B are schematic diagrams showing the structure of a first auxiliary transport robot 18A provided in the substrate processing apparatus 1A of the second embodiment by way of example. In FIGS. 12A and 12B, components equivalent to those shown in FIGS. 1 to 11 will be denoted by the same reference characters as in FIGS. 1 to 11, and duplicate description will be omitted. The same applies to FIGS. 13A to 15.

The substrate processing apparatus 1A of the second embodiment mainly differs from the substrate processing apparatus 1 of the first embodiment in that the lifter 50 of the first auxiliary transport robot 18A is transformable so as to change the attitude of the single batch of substrates W between the vertical attitude and the horizontal attitude.

According to the second embodiment, the lifter 50 of the first auxiliary transport robot 18A includes a holding portion 56 which supports the single batch of substrates W by holding the peripheries of the substrates W, a rotary support shaft 57 which turns the holding portion 56, and a connection portion 58 which is connected to the holding portion 56 via the rotary support shaft 57 to transmit the powers of the lifting mechanism 51 and the sliding mechanism 52.

The first auxiliary transport robot 18A includes an attitude changing mechanism 70 which changes the attitude of the single batch of substrates W between the vertical attitude and the horizontal attitude. The attitude changing mechanism 70 turns the holding portion 56 about the horizontal rotary support shaft 57 to transform the lifter 50. The rotary support shaft 57 and the holding portion 56 constitute an attitude converting structure which converts the attitude of the single batch of substrates W held thereby between the vertical attitude and the horizontal attitude. The attitude converting structure is driven by the attitude changing mechanism 70. FIG. 12A shows a first support state in which the lifter 50 supports the single batch of substrates W in the vertical attitude, and FIG. 12B shows a second support state in which the lifter 50 supports the single batch of substrates W in the horizontal attitude.

The attitude changing mechanism 70 includes, for example, an actuator such as an electric motor which turns the rotary support shaft 57 about its center axis A1.

<Exemplary Substrate Treatment According to Second Embodiment>

Figure 13A:
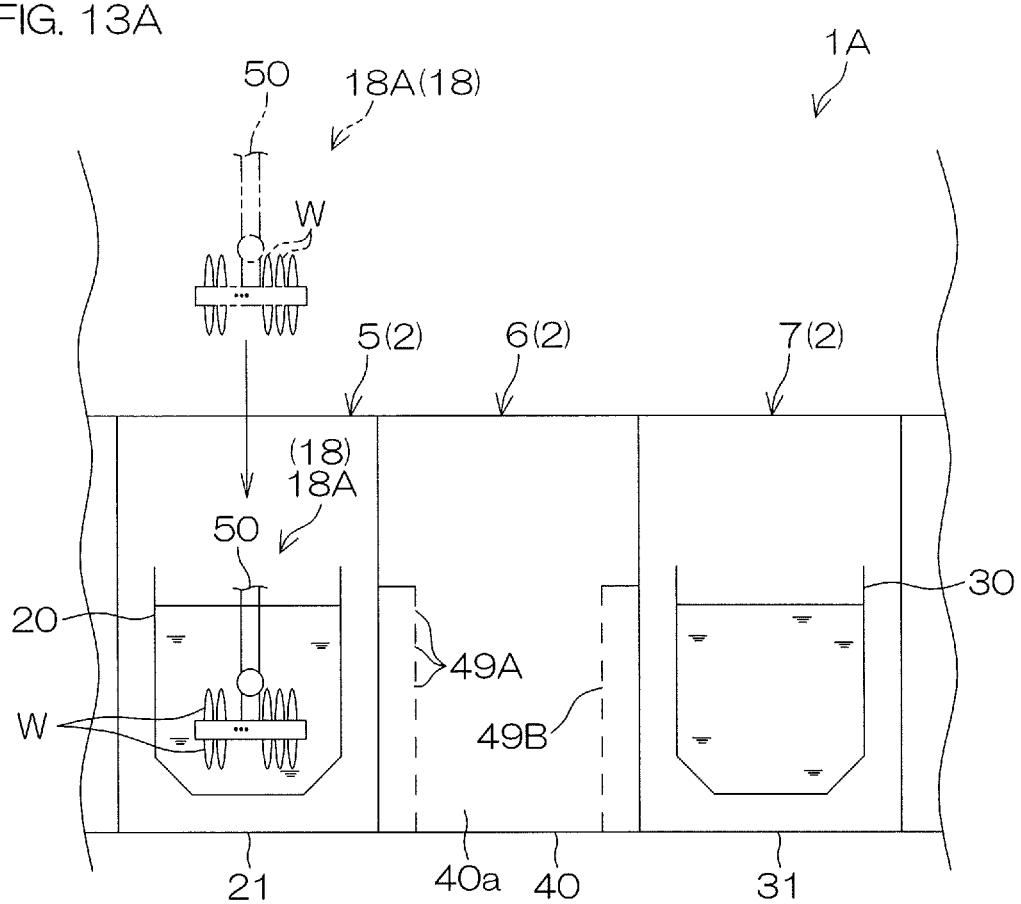
FIGS. 13A to 13C are schematic diagrams for describing how the substrate processing apparatus of the second embodiment performs the substrate treatment.
Figure 13B:
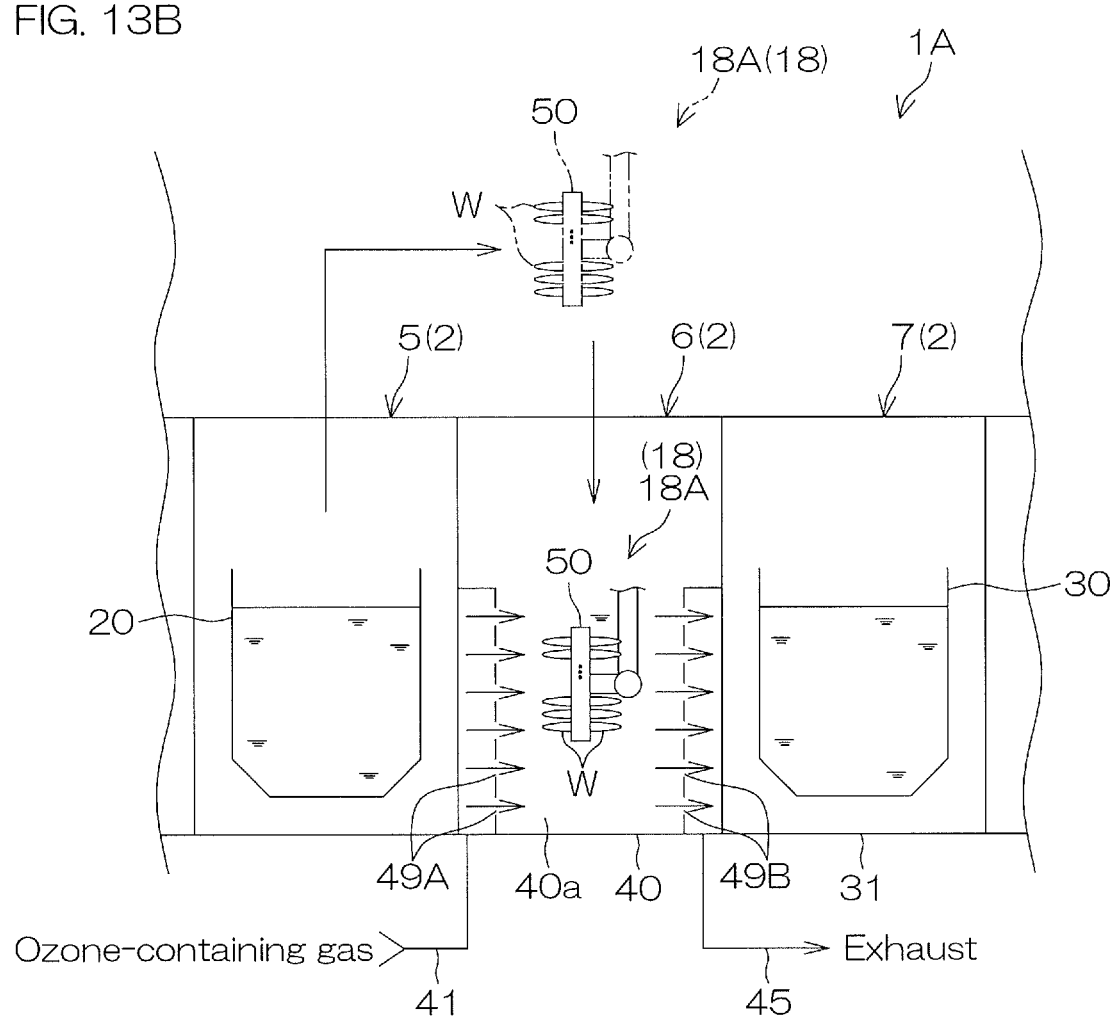
Figure 13C:
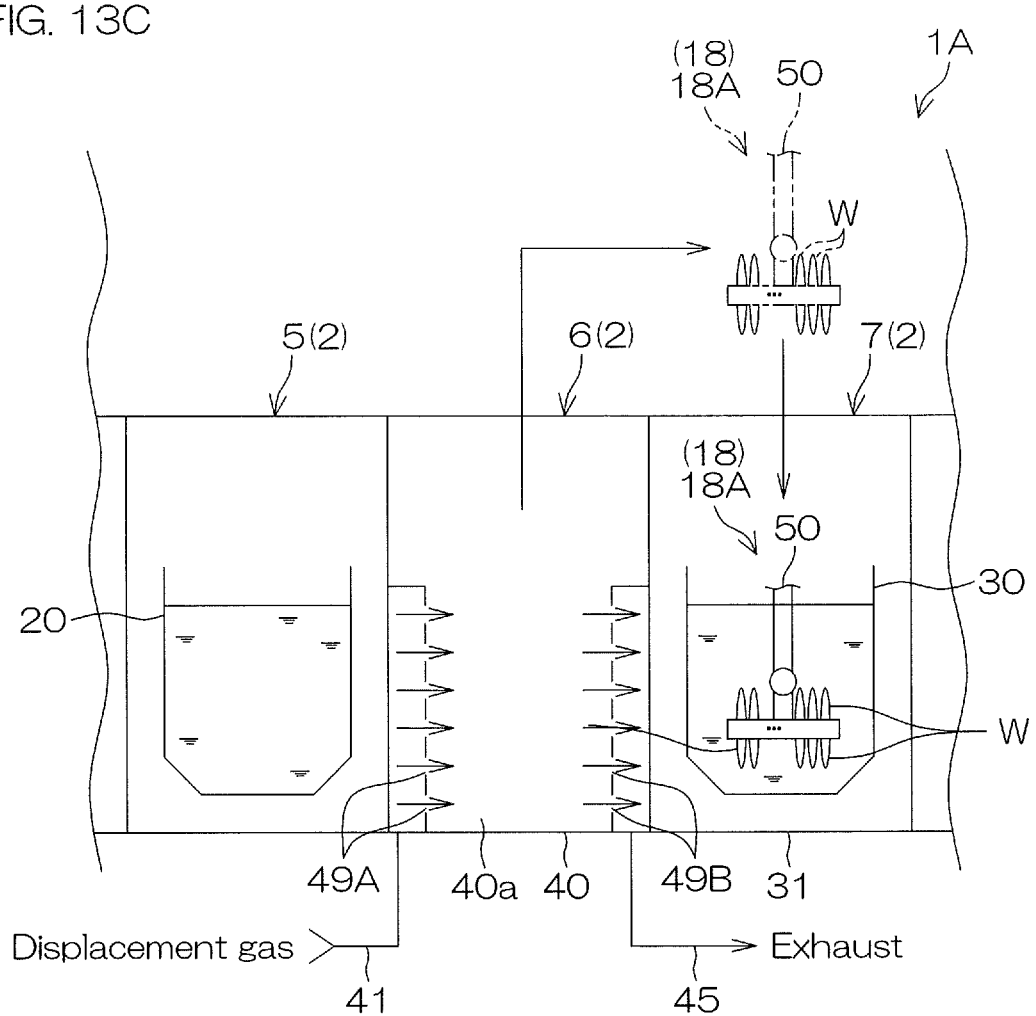

FIGS. 13A to 13C are schematic diagrams for describing how the substrate processing apparatus 1A of the second embodiment performs the substrate treatment.

The substrate processing apparatus 1A of the second embodiment is capable of performing the substrate treatment shown in FIG. 5, but performs the substrate treatment by a different procedure from that shown in FIGS. 6A to 6C. Differences will hereinafter be mainly described.

After the first auxiliary transport robot 18A receives the single batch of substrates W from the main transport robot 17, the lifter 50 is moved to the first upper position (indicated by a two-dot-and-dash line in FIG. 13A). The first auxiliary transport robot 18A may receive the single batch of substrates W from the main transport robot 17 when the lifter 50 is located at the first upper position.

In the first support state, the lifter 50 is moved down from the first upper position toward the sulfuric acid treatment position (indicated by a solid line in FIG. 13A). Thus, as shown in FIG. 13A, the single batch of substrates W is immersed in the sulfuric acid-containing liquid within the sulfuric acid vessel 20 while being held in the vertical attitude (sulfuric acid immersing step: Step S1 shown in FIG. 5).

Thereafter, the lifter 50 is moved up toward the first upper position, whereby the single batch of substrates W is taken out from the sulfuric acid-containing liquid in the sulfuric acid vessel 20. The lifter 50 is moved to the second upper position (indicated by a two-dot-and-dash line in FIG. 13B) through the first upper position. Then, the attitude changing mechanism 70 changes the state of the lifter 50 from the first support state to the second support state. Thus, the attitude of the single batch of substrates W is changed from the vertical attitude to the horizontal attitude (first attitude changing step).

Then, the lifter 50 is moved down from the second upper position toward the gas treatment position (indicated by a solid line in FIG. 13B) to be located at the gas treatment position. With the lifter 50 located at the gas treatment position, the ozone gas valve 42 and the exhaust valve 46 are opened. Thus, the internal atmosphere of the treatment space 40a is expelled from the gas treatment chamber 40, and the ozone-containing gas is supplied into the treatment space 40a. By thus supplying the ozone-containing gas into the treatment space 40a, the single batch of substrates W to which the sulfuric acid-containing liquid adheres is exposed to the ozone-containing gas while being held in the horizontal attitude (ozone exposing step: Step S2 shown in FIG. 5 (horizontal exposing step)).

The first attitude changing step may be performed before the supply of the ozone-containing gas into the treatment space 40a is started after the lifter 50 is located at the gas treatment position.

By supplying the ozone-containing gas into the treatment space 40a, the internal atmosphere of the treatment space 40a is preferably replaced with the ozone-containing gas, whereby the treatment space 40a is filled with the ozone-containing gas (ozone-containing gas filling step). With the treatment space 40a filled with the ozone-containing gas, the peroxodisulfuric acid can be speedily and sufficiently generated in the sulfuric acid-containing liquid.

Figure 14:
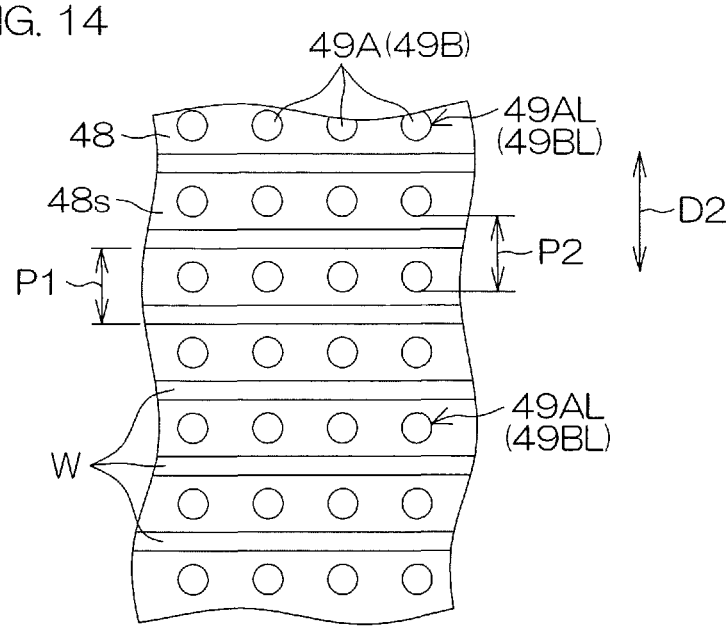
FIG. 14 is a diagram of a wall of a gas treatment chamber as seen from a treatment space of the gas treatment chamber when the lifter is located at a gas treatment position in the substrate treatment according to the second embodiment.

In the gas treatment chamber 40, as shown in FIG. 14, the supply orifices 49A are arranged in a plurality of supply orifice rows 49AL juxtaposed in a second arrangement direction D2 (vertically). The supply orifice rows 49AL each include a plurality of supply orifices 49A aligned in a predetermined row direction (horizontally in this example), and the second arrangement direction D2 intersects the row direction (orthogonally in this example). The substrates W in the single batch supported by the lifter 50 are arranged vertically. When the lifter 50 supports the single batch of substrates W in the horizontal attitude and, in this state, is located at the gas treatment position, the substrates W are located between respective adjacent pairs of the supply orifice rows 49AL as seen in a horizontal direction parallel to the major surfaces of the substrates W.

In FIG. 14, the reference character "49A" for the supply orifices and the reference character "49B" for the exhaust orifices are both shown for convenience of description. The exhaust orifices 49B are provided in the same arrangement as the supply orifices 49A. In the gas treatment chamber 40, the exhaust orifices 49B are arranged in a plurality of exhaust orifice rows 49BL juxtaposed in the second arrangement direction D2 (vertically). The exhaust orifice rows 49BL each include a plurality of exhaust orifices 49B aligned in the predetermined row direction (horizontally in this embodiment). The second arrangement direction D2 intersects the row direction (orthogonally in this example).

When the lifter 50 supports the single batch of substrates W in the horizontal attitude and, in this state, is located at the gas treatment position, the substrates W are located between respective adjacent pairs of the exhaust orifice rows 49BL as seen in a horizontal direction parallel to the major surfaces of the substrates W.

Thereafter, the lifter 50 is moved up toward the second upper position, whereby the single batch of substrates W is taken out from the gas treatment chamber 40. The lifter 50 is moved to the third upper position (indicated by a two-dot-and-dash line in FIG. 13C) through the second upper position. Then, the attitude changing mechanism 70 changes the state of the lifter 50 from the second support state to the first support state. Thus, the attitude of the single batch of substrates W is changed from the horizontal attitude to the vertical attitude (second attitude changing step).

Then, the lifter 50 is moved down from the third upper position toward the rinsing position (indicated by a solid line in FIG. 13C). Thus, as shown in FIG. 13C, the single batch of substrates W is immersed in the rinse liquid within the rinse liquid vessel 30 while being held in the vertical attitude (rinsing step: Step S3). In this manner, the second transporting step is performed to take out the single batch of substrates W from the gas treatment chamber 40 and then transport the single batch of substrates W into the rinse liquid vessel 30.

By thus immersing the single batch of substrates W in the rinse liquid within the rinse liquid vessel 30, the single batch of substrates W is rinsed. More specifically, the sulfuric acid-containing liquid in which the organic films are dissolved and the organic films separated from the substrates W are removed from the substrates W.

After the single batch of substrates W is taken out from the gas treatment chamber 40, the ozone gas valve 42 is closed, and the displacement gas valve 44 is opened. Thus, the displacement gas is supplied into the treatment space 40a in the gas treatment chamber 40, whereby the internal atmosphere of the treatment space 40a is replaced with the displacement gas. In this manner, the ozone-containing gas is expelled from the treatment space 40a (ozone expelling step).

Thereafter, the first auxiliary transport robot 18A transfers the single batch of substrates W to the main transport robot 17. The main transport robot 17 transports the single batch of substrates W received from the first auxiliary transport robot 18A to the drying unit 10. Thereafter, the single batch of substrates W is dried, and the substrates W in the single batch are consequently placed in a plurality of carriers.

According to the second embodiment, the single batch of substrates W can be immersed in the sulfuric acid-containing liquid while being held in the vertical attitude. Therefore, the substrates W in the single batch can be generally simultaneously immersed in the sulfuric acid-containing liquid. The single batch of substrates W taken out from the sulfuric acid vessel 20 is placed in the treatment space 40a, whereby the substrates W in the single batch can be simultaneously exposed to the ozone-containing gas. Therefore, the organic films can be more speedily and sufficiently removed from the substrates W.

Before the single batch of substrates W is exposed to the ozone-containing gas, the attitude of the single batch of substrates W is changed from the vertical attitude to the horizontal attitude. Therefore, the thickness variations of the sulfuric acid-containing liquid at different positions on each of the substrates W can be suppressed, which may otherwise occur when the sulfuric acid-containing liquid moves down along the substrates W by gravity. This suppresses the uneven removal of the organic film at different positions on the major surface of each of the substrates W.

According to the second embodiment, the attitude changing mechanism 70 transforms the lifter 50, whereby the attitude of the single batch of substrates W is changed between the vertical attitude and the horizontal attitude. More specifically, the lifter 50 includes the attitude converting structure which is capable of converting the attitude of the single batch of substrates W held thereby between the vertical attitude and the horizontal attitude, and the attitude converting structure is driven by the attitude changing mechanism 70.

Therefore, after the single batch of substrates W is immersed in the sulfuric acid-containing liquid within the sulfuric acid vessel 20 while being held in the vertical attitude, the attitude of the single batch of substrates W can be changed from the vertical attitude to the horizontal attitude by transforming the lifter 50 of the first auxiliary transport robot 18A (transport robot). Then, the single batch of substrates W can be exposed to the ozone-containing gas in the gas treatment chamber 40 while being held in the horizontal attitude. Thus, with the use of the single robot (first auxiliary transport robot 18A), the attitude of the single batch of substrates W can be changed, and the single batch of substrates W can be transported from the sulfuric acid vessel 20 to the gas treatment chamber 40. Since the transfer of the substrates W between robots can be obviated, the organic films can be speedily removed from the substrates W.

According to the second embodiment, the ozone-containing gas is supplied into the treatment space 40a through the supply orifices 49A and expelled from the treatment space 40a through the exhaust orifices 49B, whereby the single batch of substrates W can be exposed to the ozone-containing gas. Therefore, even if ozone in the atmosphere in contact with the sulfuric acid-containing liquid on the substrates W is dissolved in the sulfuric acid-containing liquid to be thereby consumed, ozone is supplied to the atmosphere in contact with the sulfuric acid-containing liquid adhering to the substrates W by supplying the ozone-containing gas into the treatment space 40a. Therefore, the ozone concentration of the atmosphere in contact with the sulfuric acid-containing liquid on the substrates W can be maintained at a sufficiently high level. This makes it possible to generate the peroxodisulfuric acid in the sulfuric acid-containing liquid on the substrates W.

In the gas treatment chamber 40, the supply orifice rows 49AL are juxtaposed in the second arrangement direction D2. The substrates W in the single batch are supported by the lifter 50 so as to be arranged in the second arrangement direction D2. The single batch of substrates W is placed in the treatment space 40a so that the substrates W are located between respective adjacent pairs of the supply orifice rows 49AL. Therefore, the ozone-containing gas from the supply orifice rows 49AL can be supplied between respective adjacent pairs of the substrates W. Therefore, the ozone can be sufficiently supplied into the atmosphere in contact with the sulfuric acid-containing liquid on the substrates W, and sufficiently dissolved in the sulfuric acid-containing liquid on the substrates W. As a result, it is possible to suppress the uneven removal of the organic films from the substrates W.

<Substrate Processing Apparatus According to Modification of Second Embodiment>

Figure 15:
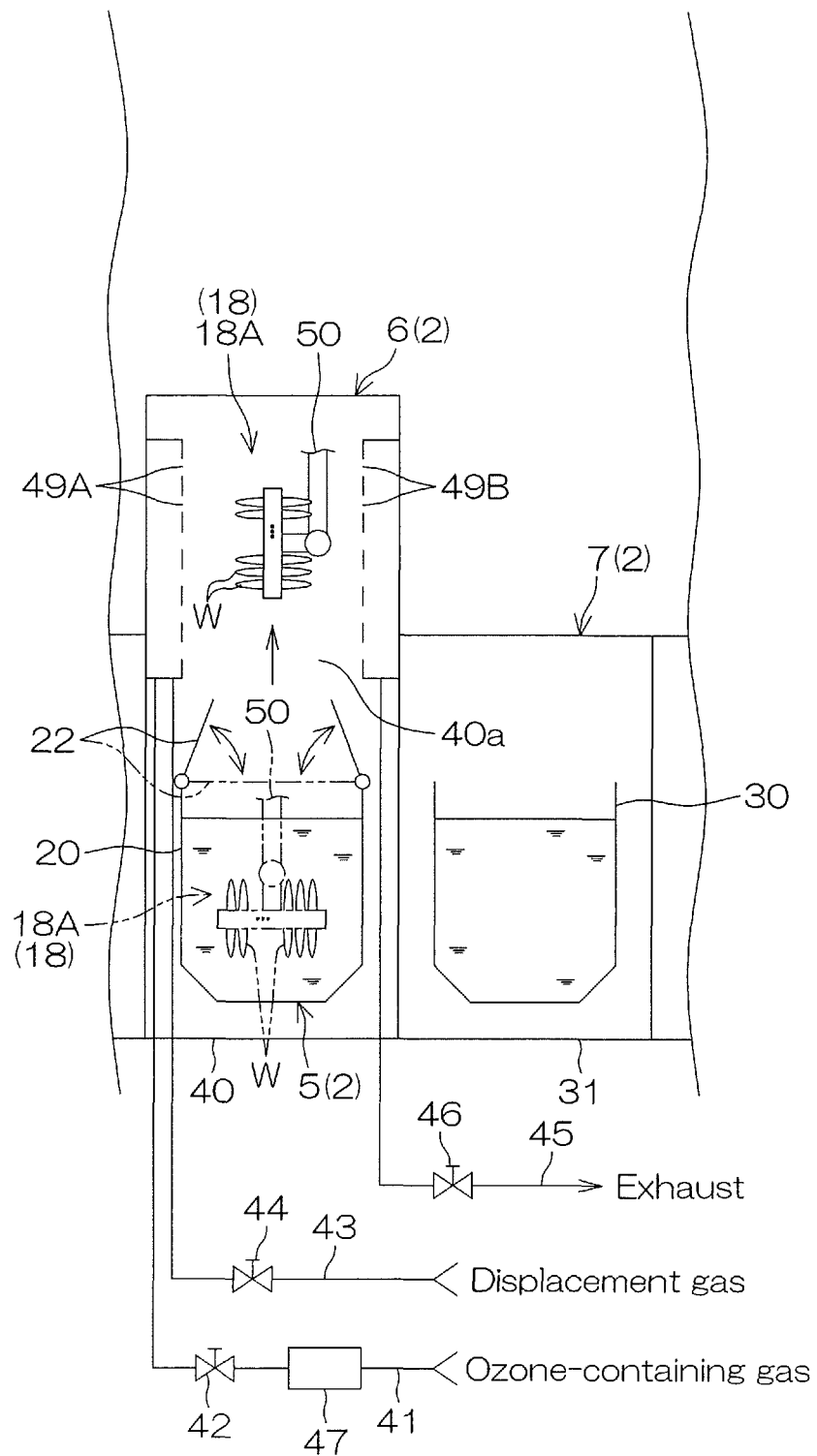
FIG. 15 is a schematic diagram for describing a substrate processing apparatus according to a modification of the second embodiment.

FIG. 15 is a schematic diagram for describing a substrate processing apparatus 1A according to a modification of the second embodiment.

In the substrate processing apparatus 1A of the modification of the second embodiment, the sulfuric acid treatment chamber 21 is not provided, but the sulfuric acid vessel 20 is provided in the gas treatment chamber 40 as in the substrate processing apparatus 1 of the first modification of the first embodiment (see FIG. 9). In the gas treatment chamber 40, the treatment space 40a is located just above the sulfuric acid vessel 20.

The substrate processing apparatus 1A of the modification of the second embodiment is capable of performing the substrate treatment in substantially the same manner as the substrate processing apparatus 1 of the modification of the first embodiment (see FIGS. 10A to 10C). That is, the single batch of substrates W held in the vertical attitude is immersed in the sulfuric acid-containing liquid within the sulfuric acid vessel 20, and then lifted from the sulfuric acid vessel 20 to be thereby placed in the treatment space 40a (first transporting step).

However, the state of the lifter 50 is changed from the first support state to the second support state by the attitude changing mechanism 70 after the single batch of substrates W is taken out from the sulfuric acid vessel 20 before the single batch of substrates W is exposed to the ozone-containing gas. Thus, the attitude of the single batch of substrates W is changed from the vertical attitude to the horizontal attitude (first attitude changing step).

The first attitude changing step may be performed after the single batch of substrates W is taken out from the sulfuric acid vessel 20 before the single batch of substrates W is placed in the treatment space 40a. Alternatively, the first attitude changing step may be performed after the lifter 50 is placed at the gas treatment position before the supply of the ozone-containing gas into the treatment space 40a is started.

According to the modification of the second embodiment, the single batch of substrates W is lifted from the sulfuric acid vessel 20 by the unidirectional movement to be thereby moved from the sulfuric acid vessel 20 into the treatment space 40a. Therefore, the single batch of substrates W can be speedily exposed to the ozone-containing gas after the sulfuric acid-containing liquid is applied to the single batch of substrates W. Thus, the organic films can be speedily removed from the substrates W.

The inside of the sulfuric acid vessel 20 and the treatment space 40a are separated from each other by the cover member 22 which covers and uncovers the sulfuric acid vessel 20. Thus, the ozone-containing gas is substantially prevented from being dissolved in the sulfuric acid-containing liquid retained in the sulfuric acid vessel 20. In the substrate treatment of the next batch of substrates W, therefore, the removal of the organic films from the substrates W can be suppressed before the start of the supply of the ozone-containing gas into the treatment space 40a. This suppresses variations in peroxodisulfuric acid treatment period from batch to batch.

<Structure of Substrate Processing Apparatus According to Third Embodiment>

Figure 16:
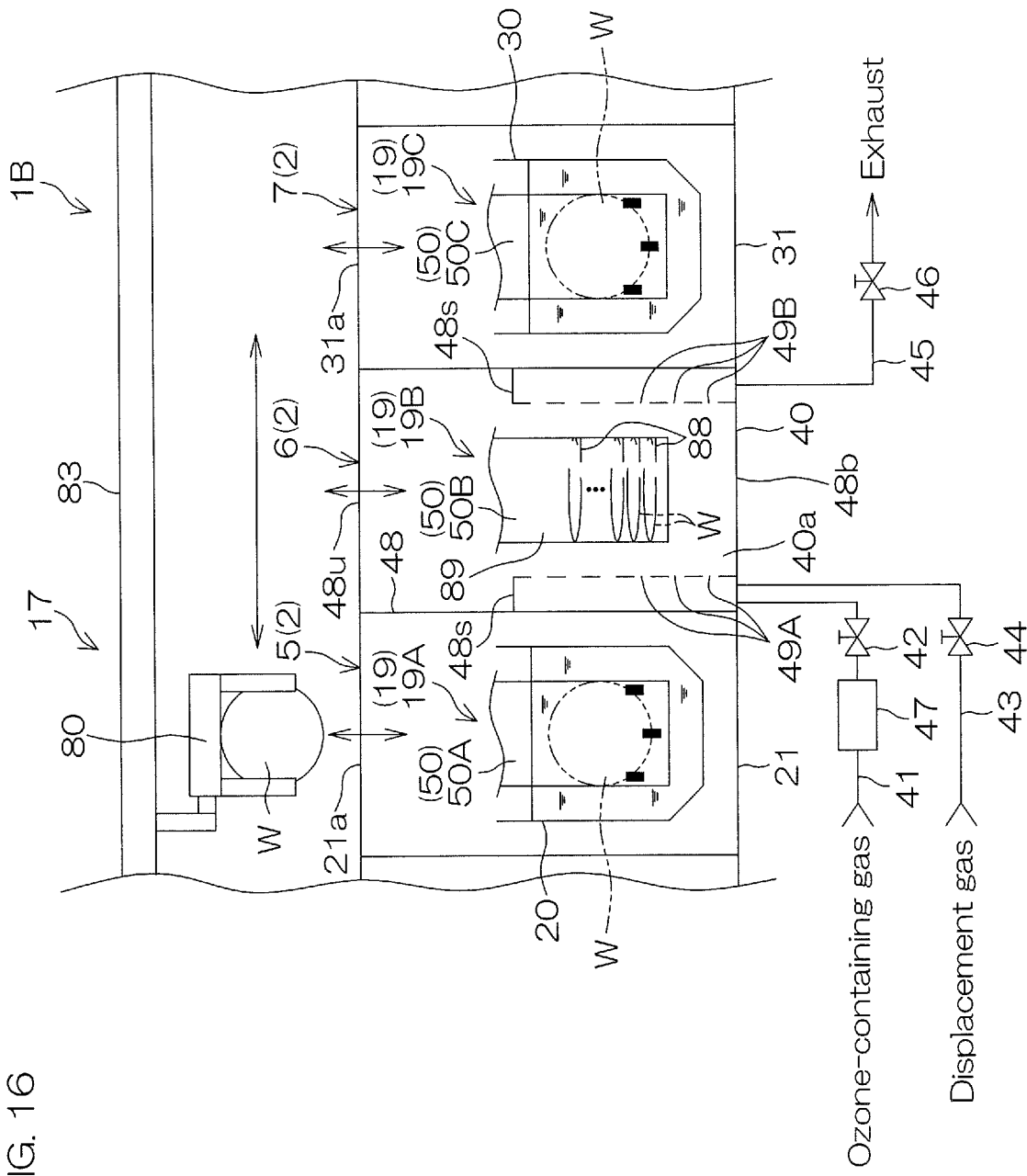
FIG. 16 is an elevational view showing the structures of major portions of a substrate processing apparatus according to a third embodiment by way of example.

Next, the structure of a substrate processing apparatus 1B according to a third embodiment will be described by way of example. FIG. 16 is an elevational view of major portions of the substrate processing apparatus 1B of the third embodiment. In FIG. 16, components equivalent to those shown in FIGS. 1 to 15 will be denoted by the same reference characters as in FIGS. 1 to 15, and duplicate description will be omitted. The same applies to FIGS. 17A to 22.

The substrate processing apparatus 1B of the third embodiment mainly differs from the substrate processing apparatus 1 of the first embodiment in that a hand 80 of the main transport robot 17 is transformable so as to change the attitude of the single batch of substrates W between the vertical attitude and the horizontal attitude. Further, a plurality of lift transport robots 19 are provided for the respective treatment units 2 instead of the auxiliary transport robots 18.

Specifically, the lift transport robots 19 include a first lift transport robot 19A which transports the single batch of substrates W between the main transport robot 17 and the sulfuric acid treatment unit 5, a second lift transport robot 19B which transports the single batch of substrates W between the main transport robot 17 and the ozone gas treatment unit 6, and a third lift transport robot 19C which transports the single batch of substrates W between the main transport robot 17 and the first rinsing unit 7. The first lift transport robot 19A is an example of the first transport robot, and the second lift transport robot 19B is an example of the second transport robot.

Though not shown, the lift transport robots 19 may include another lift transport robot which transports the single batch of substrates W between the main transport robot 17 and the chemical liquid treatment unit 8, and further another lift transport robot which transports the single batch of substrates W between the main transport robot 17 and the second rinsing unit 9.

The lift transport robots 19 each have substantially the same structure as the first auxiliary transport robot 18A shown, for example, in FIG. 3. However, the sliding mechanism 52 (see FIG. 3) is not provided in any of the lift transport robots 19.

Further, the lifter 50 of the second lift transport robot 19B has a structure such as to support the single batch of substrates W in the horizontal attitude. The lifter 50 of the second lift transport robot 19B is not particularly limited but, for example, has the following structure. The lifter 50 includes, for example, a plurality of periphery support portions 88 (e.g., periphery support portions 88 of the same number as that of the substrates W to be supported) which support the respective substrates W from below (also see FIG. 18A and the like to be described later), and a connection portion 89 which connects the periphery support portions 88 to each other.

The lifter 50 of the first lift transport robot 19A will hereinafter be referred to as first lifter 50A, and the lifter 50 of the second lift transport robot 19B will hereinafter be referred to as second lifter 50B. Further, the lifter 50 of the third lift transport robot 19C will hereinafter be referred to as third lifter 50C. The first lifter 50A and the third lifter 50C are each configured so as to support the single batch of substrates W in the vertical attitude.

The first lifter 50A can be moved up and down between the sulfuric acid treatment position and the first upper position by the lifting mechanism 51 of the first lift transport robot 19A. The second lifter 50B can be moved up and down between the gas treatment position and the second upper position by the lifting mechanism 51 of the second lift transport robot 19B. The third lifter 50C can be moved up and down between the rinsing position and the third upper position by the lifting mechanism 51 of the third lift transport robot 19C.

<Structure of Main Transport Robot According to Third Embodiment>

Figure 17A:
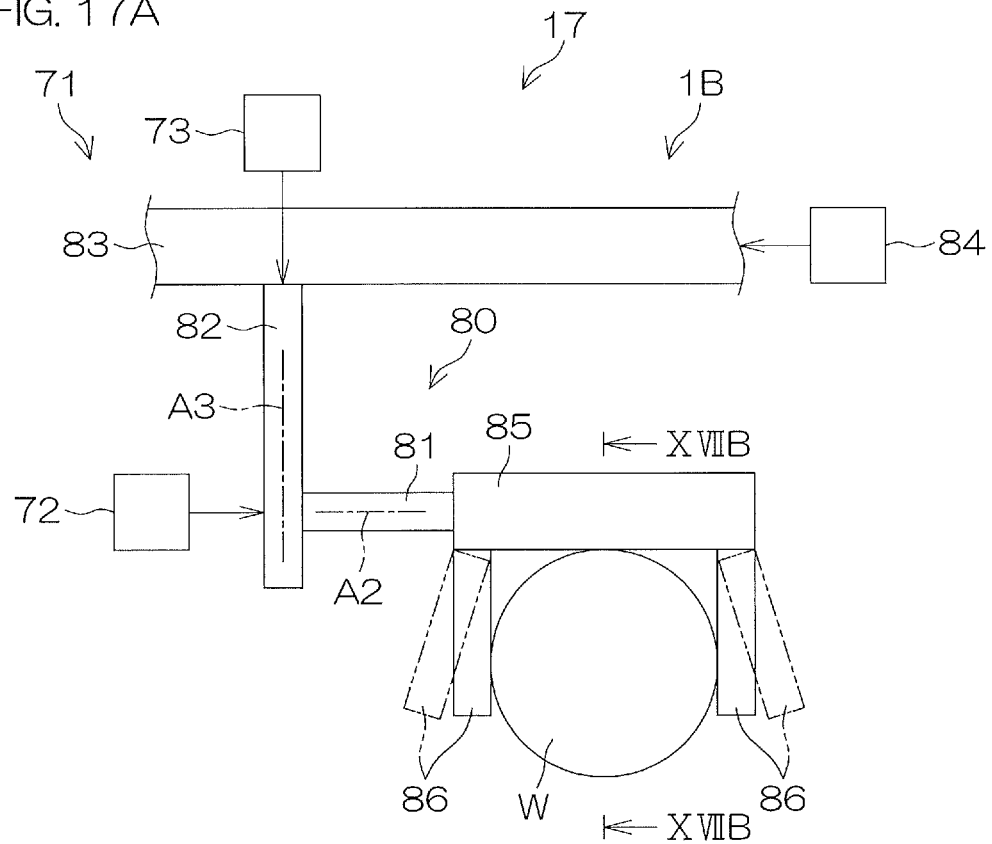
FIG. 17A is a schematic diagram showing the structure of a main transport robot provided in the substrate processing apparatus of the third embodiment by way of example.
Figure 17B:
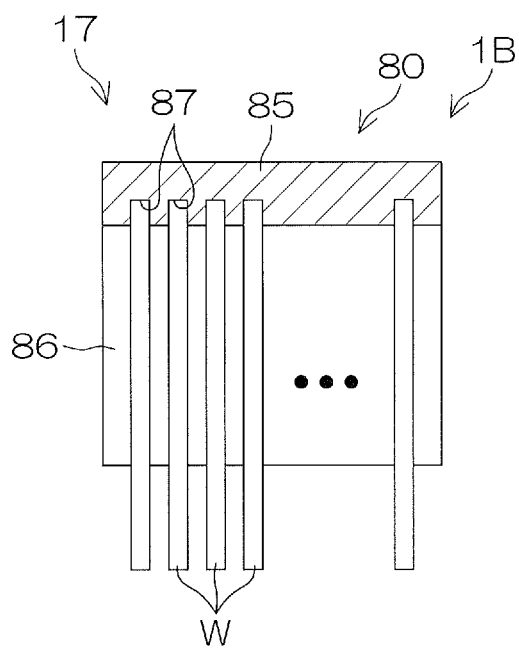
FIG. 17B is a sectional view taken along a line XVIIB-XVIIB in FIG. 17A.

FIG. 17A is a schematic diagram showing the structure of the main transport robot 17 according to the third embodiment by way of example, and FIG. 17B is a sectional view taken along a line XVIIB-XVIIB in FIG. 17A.

The main transport robot 17 is not particularly limited but, for example, has the following structure.

The main transport robot 17 includes a hand 80 capable of holding (supporting) the single batch of substrates W, and a slide rail 83 which supports the hand 80 slidably.

The main transport robot 17 further includes a hand driving mechanism 84 which moves (slides) the hand 80 horizontally along the slide rail 83. The hand 80 is horizontally moved among a first transfer position (indicated by a solid line in FIG. 18A, 18B to be described later) where the hand 80 can transfer the single batch of substrates W with respect to the first lifter 50A located at the first upper position, a second transfer position (indicated by a solid line in FIG. 18C, 18D to be described later) where the hand 80 can transfer the single batch of substrates W with respect to the second lifter 50B located at the second upper position, and a third transfer position (indicated by a solid line in FIG. 18E to be described later) where the hand 80 can transfer the single batch of substrates W with respect to the third lifter 50C located at the third upper position.

The hand 80 has a holding portion 85 which holds the single batch of substrates W, a pair of grasping portions 86 which grasp the substrates W held by the holding portion 85, a first connection shaft 81 horizontally extending and connected to the holding portion 85, and a second connection shaft 82 vertically extending and connected to the first connection shaft 81.

The pair of grasping portions 86 are opposed to each other, and are brought into contact with the peripheries of the substrates W from opposite sides of the substrates W to grasp the substrates W. The pair of grasping portions 86 are moved toward each other to grasp the single batch of substrates W, and are moved away from each other to release the single batch of substrates W.

As shown in FIG. 17B, the holding portion 85 has a plurality of holding grooves 87 for holding the substrates W. The holding portion 85 is capable of holding substrates W of the same number as that of the holding grooves 87. The grasping portions 86 may each have a roughness (not shown) so that the peripheries of the substrates W can be easily grasped.

The main transport robot 17 includes an attitude changing mechanism 71 which transforms the hand 80 to change the attitude of the single batch of substrates W. The attitude changing mechanism 71 includes a first rotating mechanism 72 which rotates the first connection shaft 81 about its center axis A2, and a second rotating mechanism 73 which rotates the second connection shaft 82 about its center axis A3.

The hand 80 is transformed by the first rotating mechanism 72 and the second rotating mechanism 73 while holding the single batch of substrates W, whereby the state of the hand 80 is switched between a first holding state (see FIG. 18A to be described later) in which the hand 80 holds the single batch of substrates W in the vertical attitude and a second holding state (see FIG. 18D to be described later) in which the hand 80 holds the single batch of substrates W in the horizontal attitude. Thus, the attitude of the single batch of substrates W can be changed between the horizontal attitude and the vertical attitude.

<Exemplary Substrate Treatment According to Third Embodiment>

FIGS. 18A to 18E are schematic diagrams for describing how the substrate processing apparatus 1B of the third embodiment performs the substrate treatment.

The substrate processing apparatus 1B of the third embodiment is capable of performing the substrate treatment shown in FIG. 5, but performs the substrate treatment by a different procedure from that shown in FIGS. 6A to 6C. Differences will hereinafter be mainly described.

The main transport robot 17 receives the single batch of substrates W from the attitude changing robot 16, and is moved to the first transfer position. The main transport robot 17 transfers the single batch of substrates W to the first lift transport robot 19A while assuming the first holding state. The attitude of the substrates W to be transferred to the first lift transport robot 19A is the vertical attitude.

The first lifter 50A of the first lift transport robot 19A is located at the first upper position (indicated by a two-dot-and-dash line in FIG. 18A) and, in this state, receives the single batch of substrates W. The single batch of substrates W are supported by the first lifter 50A of the first lift transport robot 19A.

Figure 18A:
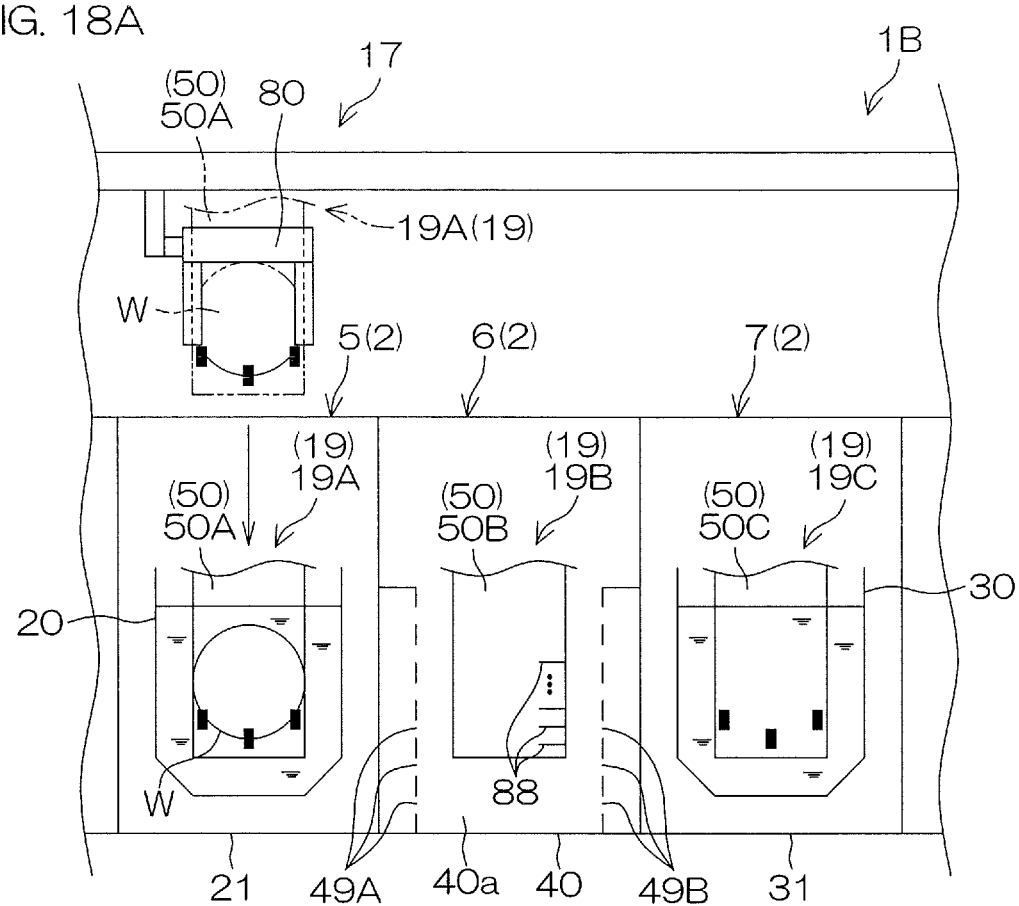

The first lifter 50A is moved down from the first upper position toward the sulfuric acid treatment position while supporting the single batch of substrates W. Thus, as shown in FIG. 18A, the single batch of substrates W is immersed in the sulfuric acid-containing liquid within the sulfuric acid vessel 20 while being held in the vertical attitude (sulfuric acid immersing step: Step S1).

Thereafter, the first lifter 50A is moved up toward the first upper position, whereby the single batch of substrates W is taken out from the sulfuric acid-containing liquid in the sulfuric acid vessel 20. As shown in FIG. 18B, the hand 80 of the main transport robot 17 receives the single batch of substrates W from the first lifter 50A located at the first upper position.

The hand 80 of the main transport robot 17 is moved to the second transfer position after receiving the single batch of substrates W from the first lifter 50A. As shown in FIG. 18C, the state of the hand 80 of the main transport robot 17 is changed to the second holding state by the attitude changing mechanism 71, whereby the attitude of the single batch of substrates W held by the hand 80 is changed from the vertical attitude to the horizontal attitude (first attitude changing step).

The attitude of the single batch of substrates W may be changed when the hand 80 is located at the first transfer position, or may be changed when the hand 80 is located at the second transfer position. Alternatively, the attitude of the single batch of substrates W may be changed at a predetermined time point when the hand 80 is on the way from the first transfer position to the second transfer position.

As shown in FIG. 18C, the second lifter 50B located at the second upper position receives the single batch of substrates W held in the horizontal attitude from the main transport robot 17 located at the second transfer position. Thereafter, the second lifter 50B is moved from the second upper position (indicated by a two-dot-and-dash line in FIG. 18D) toward the gas treatment position (indicated by a solid line in FIG. 18D).

Figure 18D:
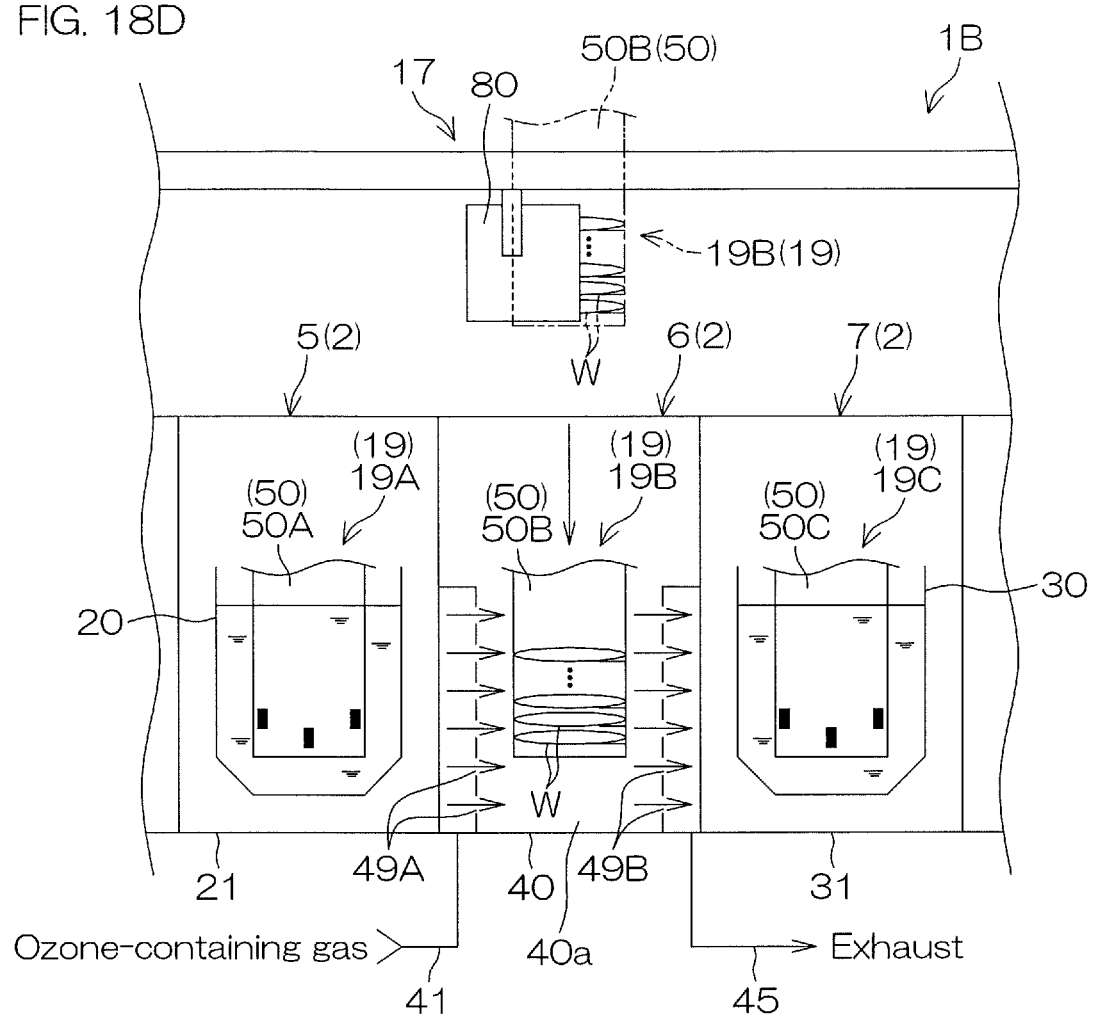

With the second lifter 50B located at the gas treatment position, the ozone gas valve 42 and the exhaust valve 46 are opened. Thus, the internal atmosphere of the treatment space 40a is expelled from the gas treatment chamber 40, and the ozone-containing gas is supplied into the treatment space 40a. By thus supplying the ozone-containing gas into the treatment space 40a, as shown in FIG. 18D, the single batch of substrates W held in the horizontal attitude is exposed to the ozone-containing gas (ozone exposing step: Step S2 shown in FIG. 5 (horizontal exposing step)).

The single batch of substrates W to which the sulfuric acid-containing liquid adheres is exposed to the ozone-containing gas, whereby the ozone in the ozone-containing gas is dissolved in the sulfuric acid-containing liquid adhering to the substrates W, and the peroxodisulfuric acid is generated in the sulfuric acid-containing liquid adhering to the substrates W. The peroxodisulfuric acid makes it possible to dissolve the organic films exposed from the substrates W in the sulfuric acid-containing liquid. Parts of the organic films are not completely dissolved in the sulfuric acid-containing liquid, but are often separated from the upper surfaces of the substrates W.

By supplying the ozone-containing gas into the treatment space 40a, the internal atmosphere of the treatment space 40a is preferably replaced with the ozone-containing gas, whereby the treatment space 40a is filled with the ozone-containing gas (ozone-containing gas filling step). With the treatment space 40a filled with the ozone-containing gas, the peroxodisulfuric acid can be speedily and sufficiently generated in the sulfuric acid-containing liquid.

Where the second lifter 50B supports the single batch of substrates W in the horizontal attitude and, in this state, is located at the gas treatment position, a positional relationship of the single batch of substrates W with respect to the supply orifice rows 49AL and the exhaust orifice rows 49BL is the same as in the second embodiment (see FIG. 14).

Thereafter, the second lifter 50B is moved up toward the second upper position, whereby the single batch of substrates W is taken out from the gas treatment chamber 40. The hand 80 of the main transport robot 17 receives the single batch of substrates W from the second lifter 50B located at the second upper position.

The hand 80 of the main transport robot 17 is moved to the third transfer position after receiving the single batch of substrates W from the second lifter 50B. As shown in FIG. 18E, the state of the hand 80 of the main transport robot 17 is changed to the first holding state by the attitude changing mechanism 71, whereby the attitude of the single batch of substrates W held by the hand 80 is changed from the horizontal attitude to the vertical attitude (second attitude changing step).

The attitude of the single batch of substrates W may be changed when the hand 80 is located at the second transfer position, or may be changed when the hand 80 is located at the third transfer position. Alternatively, the attitude of the single batch of substrates W may be changed at a predetermined time point when the hand 80 is on the way from the second transfer position to the third transfer position.

As shown in FIG. 18E, the third lifter 50C located at the third upper position receives the single batch of substrates W held in the vertical attitude from the main transport robot 17 located at the third transfer position. Thereafter, the third lifter 50C is moved down from the third upper position toward the rinsing position. Thus, the single batch of substrates W held in the vertical attitude is immersed in the rinse liquid within the rinse liquid vessel 30 (rinsing step: Step S3).

By thus immersing the single batch of substrates W in the rinse liquid within the rinse liquid vessel 30, the single batch of substrates W is rinsed. Specifically, the sulfuric acid-containing liquid in which the organic films are dissolved and the organic films separated from the substrates W are removed from the substrates W.

After the single batch of substrates W is taken out from the gas treatment chamber 40, the ozone gas valve 42 is closed and the displacement gas valve 44 is opened. Thus, the displacement gas is supplied into the treatment space 40a in the gas treatment chamber 40, whereby the internal atmosphere of the treatment space 40a is replaced with the displacement gas. Thus, the ozone-containing gas is expelled from the treatment space 40a.

Thereafter, the third lift transport robot 19C transfers the single batch of substrates W to the main transport robot 17. The main transport robot 17 transports the single batch of substrates W received from the third lift transport robot 19C to the drying unit 10.

The third embodiment provides the same effects as the second embodiment.

According to the third embodiment, the transport unit 3 includes the first lift transport robot 19A (first transport robot), the second lift transport robot 19B (second transport robot), and the main transport robot 17 which transports the single batch of substrates W between the first lift transport robot 19A and the second lift transport robot 19B. The attitude changing mechanism 71 changes the attitude of the single batch of substrates W transported by the main transport robot 17 between the horizontal attitude and the vertical attitude.

Therefore, the transportation of the single batch of substrates W to the sulfuric acid vessel 20, the transportation of the single batch of substrates W to the gas treatment chamber 40, and the change of the attitude of the single batch of substrates W are respectively achieved by the different robots. This makes the structures of the respective robots less complicated.

<Substrate Processing Apparatus According to First Modification of Third Embodiment>

Figure 19:
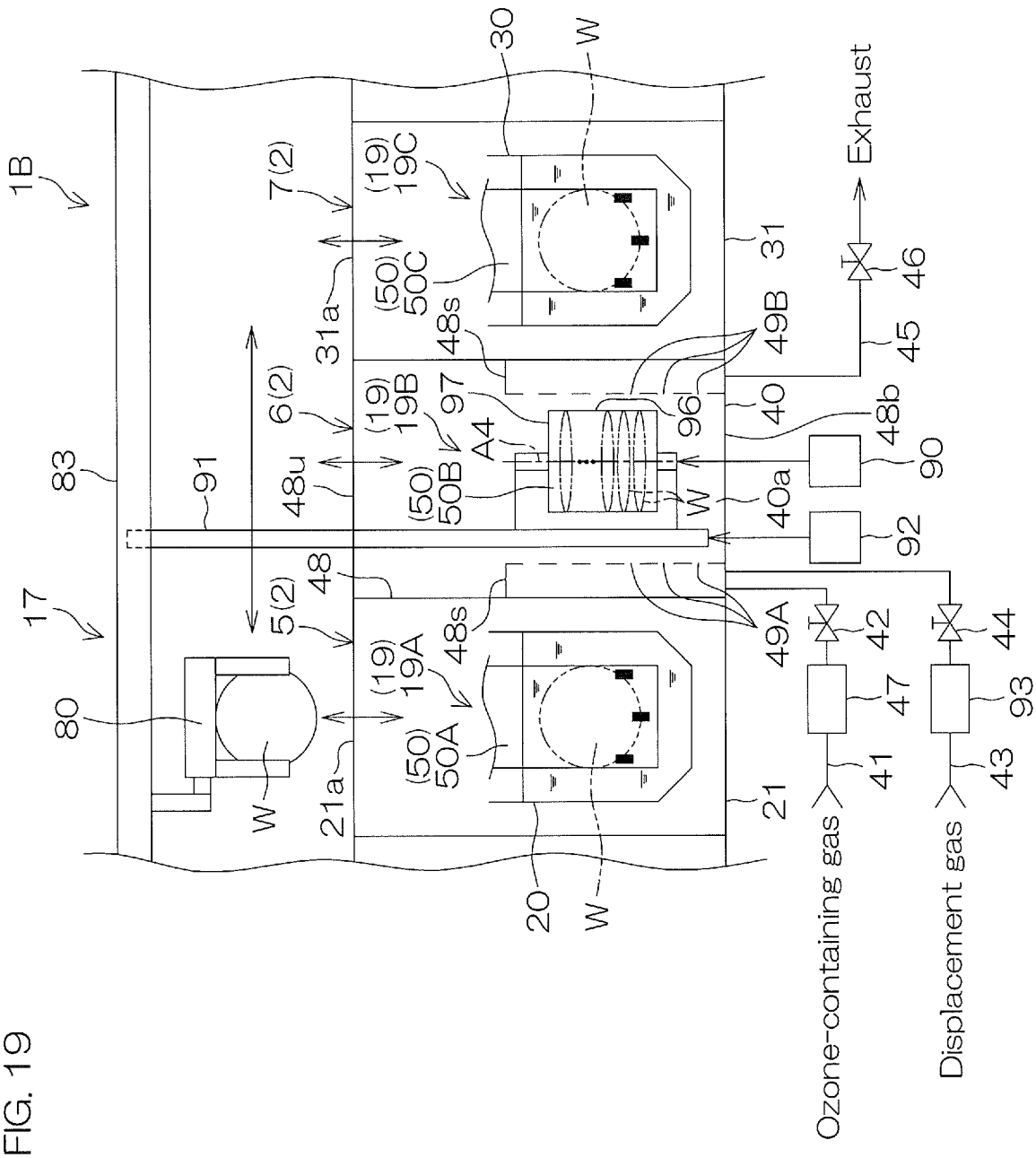
FIG. 19 is an elevational view of major portions of a substrate processing apparatus according to a first modification of the third embodiment.

FIG. 19 is an elevational view of major portions of a substrate processing apparatus 1B according to a first modification of the third embodiment.

In the first modification of the third embodiment, the second lift transport robot 19B transports the single batch of substrates W held in the horizontal attitude to the gas treatment chamber 40, and rotates the single batch of substrates W held in the horizontal attitude about a vertical axis A4 extending through the centers of the substrates W in the single batch in the gas treatment chamber 40.

Specifically, the second lift transport robot 19B includes a substrate rotating mechanism 90 which rotates the second lifter 50B about the vertical axis A4, a lift rail 91 which supports the substrate rotating mechanism 90 and the second lifter 50B in a liftable manner, and a lift driving mechanism 92 which moves up and down the second lifter 50B and the substrate rotating mechanism 90 along the lift rail 91.

In the first modification of the third embodiment, the second lifter 50B of the second lift transport robot 19B is not particularly limited but, for example, has the following structure. The second lifter 50B includes, for example, a periphery holding portion 96 which holds the peripheries of the substrates W, and a connection portion 97 which connects the lift rail 91 to the periphery holding portion 96.

Further, the ozone gas treatment unit 6 includes a displacement gas flow path heater 93 which heats the displacement gas in the displacement gas supply flow path 43.

The temperature of the displacement gas is preferably, for example, in a range of not lower than 50° C. and not higher than 270° C. The temperature of the displacement gas is preferably in a range of not lower than 50° C. and not higher than 270° C., more preferably not lower than 80° C. and not higher than 170° C.

Figure 21:
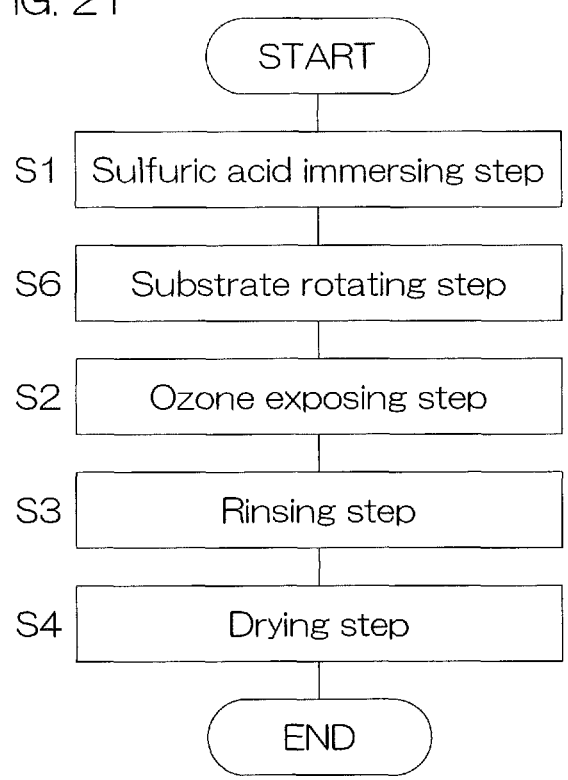
FIG. 21 is a flow chart for describing the substrate treatment to be performed by the substrate processing apparatus of the first modification of the third embodiment by way of example.

FIGS. 20A and 20B are schematic diagrams for describing how the substrate processing apparatus 1B of the first modification of the third embodiment performs the substrate treatment. FIG. 21 is a flow chart for describing the substrate treatment to be performed by the substrate processing apparatus 1B of the first modification of the third embodiment by way of example.

The substrate processing apparatus 1B of the first modification of the third embodiment is capable of performing the substrate treatment by substantially the same procedure as in the third embodiment shown in FIGS. 18A to 18E. Differences from the substrate treatment procedure shown in FIGS. 18A to 18E will hereinafter be mainly described.

As shown in FIG. 21, the substrate processing apparatus 1B of the first modification of the third embodiment performs a substrate rotating step (Step S6) before the start of the ozone exposing step (Step S2) after the sulfuric acid immersing step (Step S1). This will be detailed below.

In the substrate treatment according to the first modification of the third embodiment, the single batch of substrates W is immersed in the sulfuric acid-containing liquid, and then transferred from the first lifter 50A to the main transport robot 17, as in the substrate treatment according to the third embodiment. Thereafter, as shown in FIG. 20A, the second lifter 50B located at the second upper position receives the single batch of substrates W held in the horizontal attitude from the main transport robot 17 located at the second transfer position in the second holding state. Then, the second lifter 50B is moved from the second upper position (see FIG. 20A) toward the gas treatment position (indicated by a solid line in FIG. 20B).

The second lifter 50B is rotated about the vertical axis A4 while being located at the gas treatment position. Thus, the single batch of substrates W is rotated together with the second lifter 50B (substrate rotating step: Step S6 shown in FIG. 21). Thus, the sulfuric acid-containing liquid is partly scattered around the substrates W, whereby liquid films of the sulfuric acid-containing liquid adhering to the major surfaces of the respective substrates W are thinned (sulfuric acid film thinning step).

After the rotation of at least the single batch of substrates W is started, the ozone gas valve 42 and the exhaust valve 46 are opened. Thus, the internal atmosphere of the treatment space 40a is expelled from the gas treatment chamber 40, and the ozone-containing gas is supplied into the treatment space 40a. By thus supplying the ozone-containing gas into the treatment space 40a, as shown in FIG. 20B, the single batch of substrates W held in the horizontal attitude is exposed to the ozone-containing gas (ozone exposing step: Step S2 shown in FIG. 21). During the supply of the ozone-containing gas, the single batch of substrates W may be rotated, or the rotation of the single batch of substrates W may be stopped.

After the single batch of substrates W is exposed to the ozone-containing gas, the second lifter 50B is moved to the second upper position with the rotation thereof stopped. Thereafter, the single batch of substrates W is transferred to the main transport robot 17, and the rinsing step (Step S3 shown in FIG. 21) and the drying step (Step S4 shown in FIG. 21) are performed.

According to the first modification of the third embodiment, the single batch of substrates W is rotated about the vertical axis A4 before being exposed to the ozone-containing gas in the ozone exposing step after the attitude changing step.

Therefore, an excess amount of the sulfuric acid-containing liquid can be removed from the substrates W, thereby improving the thickness evenness of the sulfuric acid-containing liquid at different positions on each of the substrates. This improves the evenness of the ozone concentration of the sulfuric acid-containing liquid at different positions on each of the substrates. As a result, it is possible to suppress the uneven removal of the organic film at different positions on each of the substrates.

Unlike in the first modification, the displacement gas may be supplied into the treatment space 40a to heat the single batch of substrates W before the ozone-containing gas is supplied into the treatment space 40a after the start of the rotation of the single batch of substrates W. By entirely heating the single batch of substrates W with the displacement gas before the supply of the ozone-containing gas, the activity of the peroxodisulfuric acid can be evenly improved. This makes it possible to suppress the uneven removal of the organic films from the substrates W.

<Substrate Processing Apparatus According to Second Modification of Third Embodiment>

Figure 22:
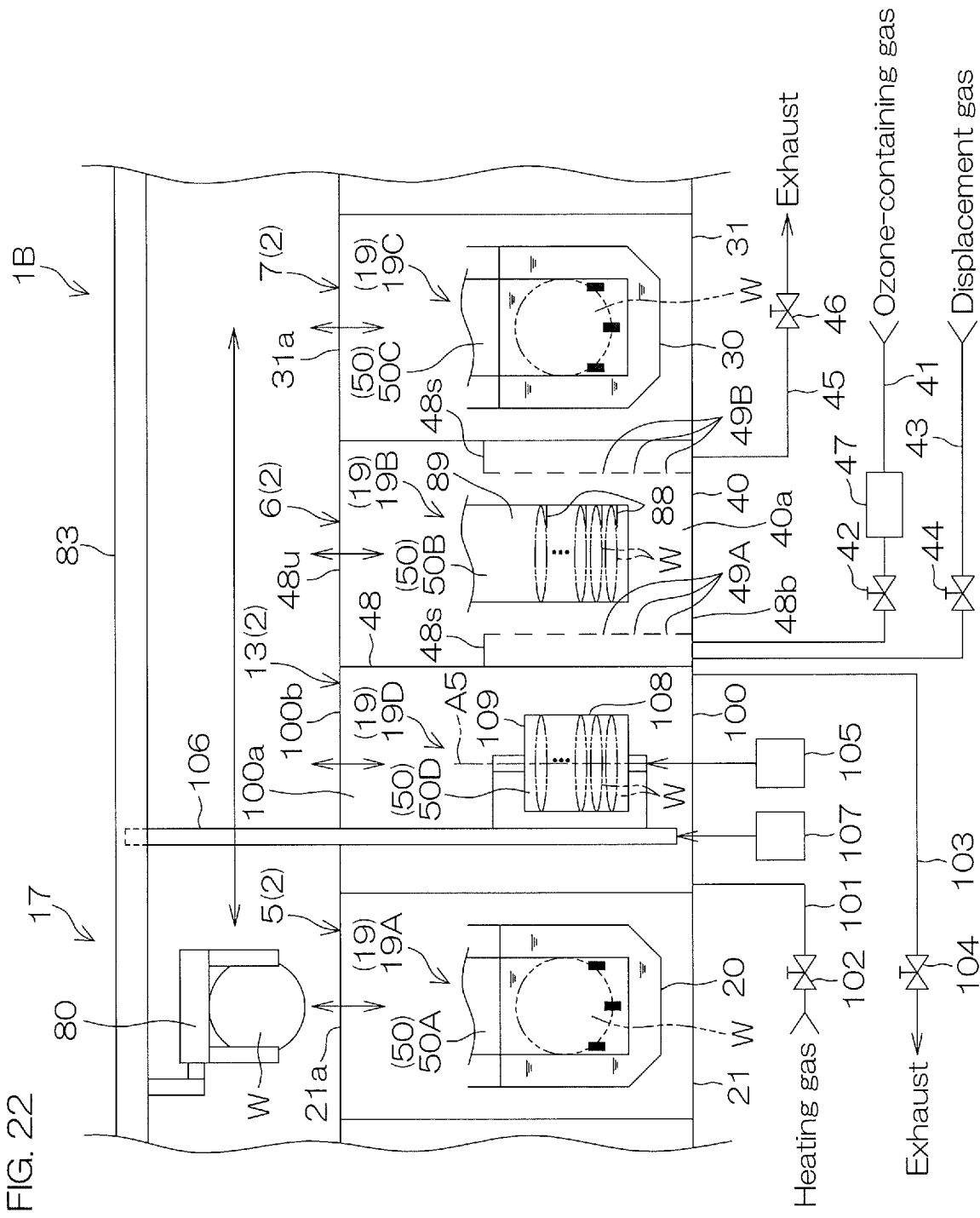
FIG. 22 is an elevational view of major portions of a substrate processing apparatus according to a second modification of the third embodiment.

FIG. 22 is an elevational view of major portions of a substrate processing apparatus 1B according to a second modification of the third embodiment.

Unlike the substrate processing apparatus 1B shown in FIG. 16, the substrate processing apparatus 1B of the second modification of the third embodiment further includes a heating unit 13 which heats the single batch of substrates W while rotating the single batch of substrates W.

The heating unit 13 includes a heating chamber 100 having a heating space 100a which is capable of accommodating the single batch of substrates W. The heating chamber 100 has an openable/closable upper end portion 100b. The heating unit 13 includes a heating gas supply flow path 101 which supplies the heating gas into the heating chamber 100, a heating gas valve 102 which opens and closes the heating gas supply flow path 101, a heating gas exhaust flow path 103 through which the internal atmosphere of the heating chamber 100 is expelled, and a heating gas exhaust valve 104 which opens and closes the heating gas exhaust flow path 103.

The heating gas is, for example, an inert gas. The temperature of the heating gas is preferably, for example, in a range of not lower than 50° C. and not higher than 270° C. The temperature of the heating gas is preferably in a range of not lower than 50° C. and not higher than 270° C., more preferably not lower than 80° C. and not higher than 170° C.

The substrate processing apparatus 1B further includes a fourth lift transport robot 19D which transports the single batch of substrates W between the main transport robot 17 and the heating unit 13. The fourth lift transport robot 19D is an example of the third transport robot. The fourth lift transport robot 19D has, for example, substantially the same structure as the first auxiliary transport robot 18A shown in FIG. 3.

However, the fourth lift transport robot 19D does not have the sliding mechanism 52. Further, the fourth lift transport robot 19D is configured so as to support the single batch of substrates W in the horizontal attitude.

The fourth lift transport robot 19D includes a fourth lifter 50D, a substrate rotating mechanism 105 which rotates the fourth lifter 50D about a vertical axis A5, a lift rail 106 which supports the substrate rotating mechanism 105 and the fourth lifter 50D in a liftable manner, and a lift driving mechanism 107 which moves the fourth lifter 50D and the substrate rotating mechanism 105 along the lift rail 106.

The fourth lifter 50D of the fourth lift transport robot 19D is not particularly limited but, for example, has the following structure. The fourth lifter 50D includes, for example, a periphery holding portion 108 which holds the peripheries of the substrates W, and a connection portion 109 which connects the periphery holding portion 108 to the lift rail 106. The fourth lifter 50D of the fourth lift transport robot 19D is movable up and down between a fifth upper position just above the heating unit 13 and a heating position where the single batch of substrates W is accommodated in the heating space 100a.

The fourth lift transport robot 19D transports the single batch of substrates W held in the horizontal attitude to the heating chamber 100, and rotates the single batch of substrates W held in the horizontal attitude about the vertical axis A5 extending through the centers of the substrates W in the heating chamber 100.

In the second modification of the third embodiment, the hand 80 of the main transport robot 17 is movable to a fourth transfer position where the hand 80 can transfer the single batch of substrates W with respect to the fourth lifter 50D located at the fifth upper position.

In the second modification of the third embodiment, the substrate treatment shown in FIG. 21 can be performed. That is, the substrate processing apparatus 1B of the second modification of the third embodiment performs the substrate rotating step (Step S6) before the ozone exposing step (Step S2) is started after the sulfuric acid immersing step (Step S1). This will be detailed below.

In the substrate treatment of the second modification of the third embodiment, the single batch of substrates W is immersed in the sulfuric acid-containing liquid, and then transferred from the first lifter 50A to the main transport robot 17 as in the substrate treatment of the third embodiment. Thereafter, the fourth lifter 50D located at the fifth upper position receives the single batch of substrates W held in the horizontal attitude from the main transport robot 17 located at the fourth transfer position. Then, the fourth lifter 50D is moved from the fifth upper position toward the heating position.

The fourth lifter 50D is rotated about the vertical axis A5 while being located at the heating position. Thus, the single batch of substrates W is rotated together with the fourth lifter 50D (substrate rotating step: Step S6). Thus, the sulfuric acid-containing liquid is partly scattered around the substrates W, whereby liquid films of the sulfuric acid-containing liquid adhering to the major surfaces of the substrates W are thinned (sulfuric acid film thinning step).

Simultaneously with or after the start of the rotation of the single batch of substrates W, the heating gas valve 102 and the heating gas exhaust valve 104 are opened. Thus, the internal atmosphere of the heating space 100a is expelled from the heating chamber 100, and the heating gas is supplied into the heating space 100a. By thus supplying the heating gas into the heating space 100a, the single batch of substrates W held in the horizontal attitude is heated (heating/rotating step).

Thereafter, the single batch of substrates W is transferred from the fourth lifter 50D to the main transport robot 17. Then, the ozone exposing step (Step S2 in FIG. 21), the rinsing step (Step S3 in FIG. 21) and the drying step (Step S4 in FIG. 21) are performed.

According to the second modification of the third embodiment, the single batch of substrates W is rotated in the heating chamber 100, whereby an excess amount of the sulfuric acid-containing liquid can be removed from the substrates W. Where the excess amount of the sulfuric acid-containing liquid is thus removed by the rotation of the substrates W, it is possible to improve the thickness evenness of the sulfuric acid-containing liquid at different positions on each of the substrates W.

Since the excess amount of the sulfuric acid-containing liquid is removed from the substrates W in the heating chamber 100, it is possible to heat the single batch of substrates W while removing the sulfuric acid-containing liquid. Where the single batch of substrates W thus heated is transported into the gas treatment chamber 40 via the main transport robot 17 and the second lift transport robot 19B, the single batch of substrates W removed of the excess amount of the sulfuric acid-containing liquid and heated can be exposed to the ozone-containing gas. This makes it possible to improve the evenness of the ozone concentration of the sulfuric acid-containing liquid at different positions on each of the substrates W while enhancing the activity of the peroxodisulfuric acid. As a result, it is possible to further suppress the uneven removal of the organic film at different positions on each of the substrates W.

Unlike in the second modification, the heating chamber 100 may be sufficiently heated by opening the heating gas valve 102 and the heating gas exhaust valve 104 before the start of the rotation of the single batch of substrates W.

<Other Embodiments>

The present invention is not limited to the embodiments described above, but may be embodied in some other ways. Other embodiments will be described below by way of example.

Figure 23:
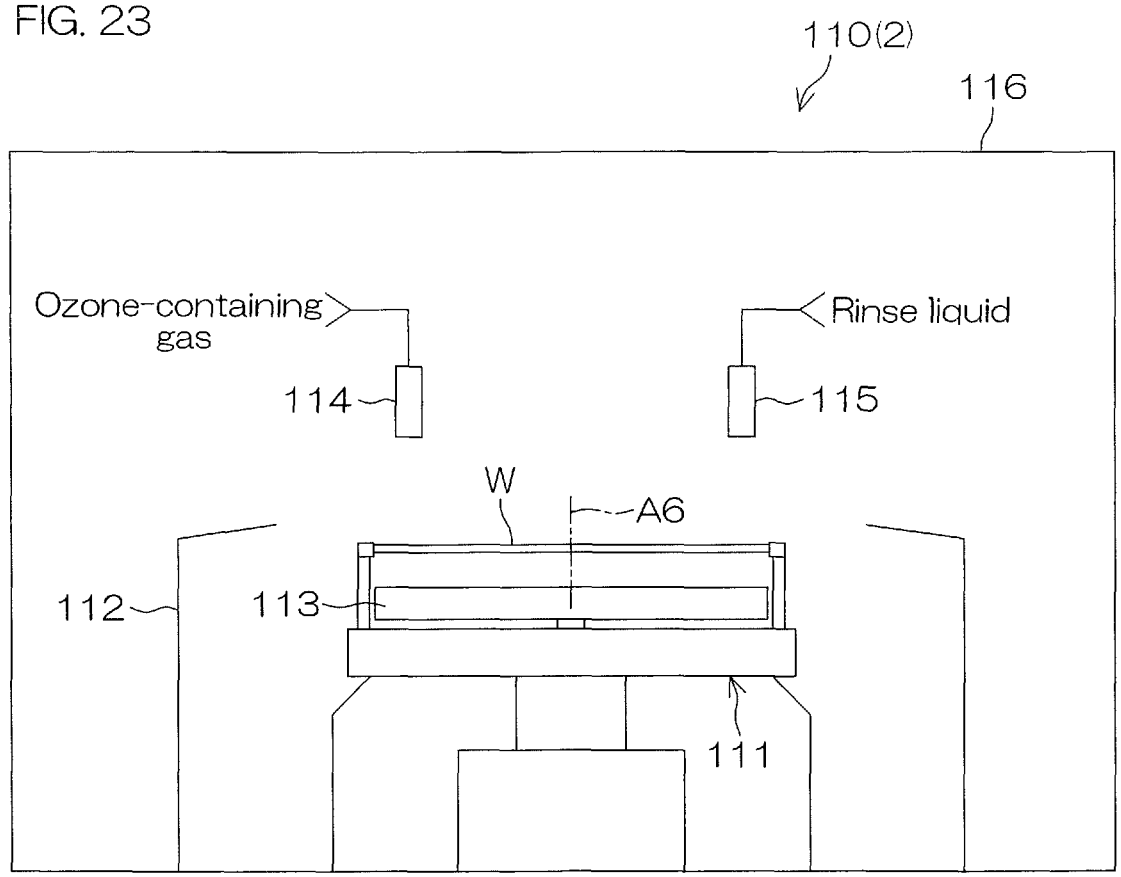
FIG. 23 is a schematic diagram for describing the structure of a single-substrate treatment unit provided in the substrate processing apparatus by way of example.

(1) The treatment units 2 may include a single-substrate treatment unit 110 which is adapted to treat the substrates W one by one as shown in FIG. 23. Specifically, the single-substrate treatment unit 110 includes a spin chuck 111, a treatment cup 112, a heater 113, an ozone-containing gas nozzle 114, a rinse liquid nozzle 115, and a chamber 116.

The spin chuck 111 rotates a substrate W about a vertical axis A6 extending through the center of the substrate W, while holding the substrate W in the horizontal attitude. The treatment cup 112 surrounds the spin chuck 111 to receive a treatment liquid scattered from the substrate W. The heater 113 heats the substrate W held by the spin chuck 111. The ozone-containing gas nozzle 114 supplies an ozone-containing gas toward the substrate W. The rinse liquid nozzle 115 supplies a rinse liquid toward the substrates W.

After the single batch of substrates W is immersed in the sulfuric acid-containing liquid within the sulfuric acid vessel 20, one of the substrates W in the single batch is transported into the single-substrate treatment unit 110 (transporting step). The substrate W transported into the single-substrate treatment unit 110 is rotated by the spin chuck 111, and heated by the heater 113 (substrate rotating step). Thereafter, the ozone-containing gas is spouted from the ozone-containing gas nozzle 114, whereby the substrate W to which the sulfuric acid-containing liquid adheres is exposed to the ozone-containing gas (ozone exposing step). The single-substrate treatment unit 110 is an example of the ozone gas treatment unit.

Thereafter, the rinse liquid is spouted from the rinse liquid nozzle 115, whereby the substrate W is rinsed. Then, the substrate W is rotated at a higher speed by the spin chuck 111, whereby the substrate W is dried (drying step).

Where a plurality of single-substrate treatment units 110 are provided, all the substrates W in the single batch can be speedily exposed to the ozone-containing gas after being immersed in the sulfuric acid-containing liquid.

(2) A heater 120 (indicated by a two-dot-and-dash line in FIG. 2) which heats the sulfuric acid-containing liquid retained in the sulfuric acid vessel 20 may be provided in the sulfuric acid vessel 20. For example, the temperature of the sulfuric acid-containing liquid is preferably not lower than 150° C. By thus heating the sulfuric acid-containing liquid by means of the heater 120, the activity of the peroxodisulfuric acid can be enhanced, making it possible to speedily remove the organic films. A heater which heats the sulfuric acid-containing liquid in the piping for supplying the sulfuric acid-containing liquid to the sulfuric acid vessel 20 may be provided instead of the heater 120. The sulfuric acid-containing liquid used in the sulfuric acid vessel 20 may be drained from the sulfuric acid vessel 20 to be reused.

(3) In the first modification of the first embodiment and the modification of the second embodiment, the sulfuric acid vessel 20 is provided in the gas treatment chamber 40. Alternatively, the sulfuric acid vessel 20 may be accommodated in the sulfuric acid treatment chamber 21, and the gas treatment chamber 40 may be disposed just above the sulfuric acid treatment chamber 21.

(4) Where the mechanism for changing the attitude of the substrates W is provided in neither the lifter 50 nor the hand 80, the attitude of the single batch of substrates W may be changed from the vertical attitude to the horizontal attitude by the attitude changing robot 16 after the sulfuric acid immersing step. Similarly, the attitude of the single batch of substrates W may be changed from the horizontal attitude to the vertical attitude by the attitude changing robot 16 after the ozone exposing step.

With the use of the substrate processing apparatus 1A described above, the sulfuric acid immersing step, the ozone exposing step and the rinsing step can be performed with the attitude of the single batch of substrates W maintained in the horizontal attitude.

(5) The treatment space 40a may be filled with the ozone-containing gas, before the single batch of substrates W is transported into the ozone gas treatment unit 6. In this case, the single batch of substrates W can be exposed to the ozone-containing gas by transporting the single batch of substrates W into the ozone gas treatment unit 6. What is important is that the single batch of substrates W transported into the ozone gas treatment unit 6 is exposed to the ozone-containing gas. That is, the supply of the ozone-containing gas into the treatment space 40a may be started before the single batch of substrates W is placed in the treatment space 40a, or may be started after the single batch of substrates W is placed in the treatment space 40a.

(6) In the embodiments described above, the controller 4 controls the entire substrate processing apparatus 1. Alternatively, controllers which control the respective components of the substrate processing apparatus 1 may be provided separately at different positions. Further, the controller 4 is not necessarily required to directly control the respective components, but signals outputted from the controller 4 may be received by slave controllers which control the respective components of the substrate processing apparatus 1.

(7) In the embodiments described above, the terms "horizontal" and "vertical" are not required to be used in the strict sense of these terms, but are intended to permit deviations in production accuracy, installation accuracy and the like.

(8) The components of the substrate processing apparatuses are each schematically illustrated in the form of block, but the shapes, the sizes and the positional relationships of the blocks do not show the actual shapes, the actual sizes and the actual positional relationships of the respective components.

While the embodiments of the present invention have been described in detail, these embodiments are merely specific examples that are illustrative of the technical principles of the present invention but not limitative of the invention. The spirit and scope of the present invention are limited only by the appended claims.

What is claimed is:

1. A substrate processing method comprising:
a sulfuric acid immersing step of immersing a plurality of substrates in a sulfuric acid-containing liquid within a sulfuric acid vessel;
a transporting step of taking out the substrates from the sulfuric acid vessel and transporting the substrates to an ozone gas treatment unit with the sulfuric acid-containing liquid adhering to the substrates; and
an ozone exposing step of exposing the substrates transported to the ozone gas treatment unit to an ozone-containing gas such that ozone contained in the ozone-containing gas is dissolved in the sulfuric acid-containing liquid adhering to the substrates so as to generate peroxodisulfuric acid in the adhering sulfuric acid-containing liquid.

2. The substrate processing method according to claim 1,
wherein the ozone gas treatment unit includes a gas treatment chamber which accommodates the substrates,
wherein the ozone exposing step includes the step of placing the substrates taken out of the sulfuric acid vessel in a treatment space within the gas treatment chamber to expose the substrates to the ozone-containing gas.

3. The substrate processing method according to claim 2, wherein the ozone exposing step includes the step of supplying the ozone-containing gas into the treatment space from a plurality of supply orifices which open in a wall defining the treatment space, and exhausting the treatment space through a plurality of exhaust orifices which open in the wall, whereby the substrates placed in the treatment space is exposed to the ozone-containing gas.

4. The substrate processing method according to claim 3,
wherein the supply orifices are arranged in a plurality of supply orifice rows juxtaposed in a predetermined arrangement direction in the gas treatment chamber,
wherein the ozone exposing step includes the step of placing the substrates in the treatment space so that the substrates are arranged in the arrangement direction and located between respective adjacent pairs of the supply orifice rows.

5. A substrate processing method comprising:
a sulfuric acid immersing step of immersing a plurality of substrates in a sulfuric acid-containing liquid within a sulfuric acid vessel;
a transporting step of taking out the substrates from the sulfuric acid vessel and transporting the substrates to an ozone gas treatment unit; and
an ozone exposing step of exposing the substrates transported to the ozone gas treatment unit to an ozone-containing gas,
wherein the sulfuric acid immersing step includes a vertical immersing step of immersing the substrates in the sulfuric acid-containing liquid within the sulfuric acid vessel while holding the substrates in a vertical attitude,
the substrate processing method further comprising an attitude changing step of changing attitude of the substrates taken out of the sulfuric acid vessel from the vertical attitude to a horizontal attitude,
wherein the ozone exposing step includes a horizontal exposing step of exposing the substrates to the ozone-containing gas while holding the substrates in the horizontal attitude.

6. The substrate processing method according to claim 5, further comprising a substrate rotating step of rotating the substrates held in the horizontal attitude about a vertical axis extending through centers of the substrates before the exposure of the substrates to the ozone-containing gas in the ozone exposing step after the attitude changing step.

7. The substrate processing method according to claim 2,
wherein the treatment space is located just above the sulfuric acid vessel,
wherein the transporting step includes the step of lifting the substrates from the sulfuric acid vessel to place the substrates in the treatment space.

\* \* \* \* \*